United States Patent
Katayama

(10) Patent No.: US 11,538,512 B2
(45) Date of Patent: Dec. 27, 2022

(54) MEMORY DEVICE THAT EXECUTES A READ OPERATION BASED ON A SELF-REFERENCE SCHEME

(71) Applicant: Kioxia Corporation, Tokyo (JP)

(72) Inventor: Akira Katayama, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/200,966

(22) Filed: Mar. 15, 2021

(65) Prior Publication Data

US 2022/0084575 A1 Mar. 17, 2022

(30) Foreign Application Priority Data

Sep. 16, 2020 (JP) .............................. JP2020-155568

(51) Int. Cl.
*G11C 11/16* (2006.01)
(52) U.S. Cl.
CPC ................................ *G11C 11/1673* (2013.01)
(58) Field of Classification Search
None
See application file for complete search history.

(56) References Cited

U.S. PATENT DOCUMENTS

| | | | |
|---|---|---|---|
| 8,902,636 B2 | 12/2014 | Katayama | |
| 9,001,559 B2 | 4/2015 | Takahashi et al. | |
| 9,484,091 B2 | 11/2016 | Takahashi et al. | |
| 9,741,434 B2 | 8/2017 | Katayama et al. | |
| 9,761,293 B2 | 9/2017 | Katayama | |
| 9,824,736 B1 | 11/2017 | Katayama | |
| 9,953,707 B2 | 4/2018 | Katayama | |
| 10,157,655 B2 * | 12/2018 | Fujino | G11C 7/06 |
| 10,360,976 B2 | 7/2019 | Katayama | |
| 10,388,345 B2 | 8/2019 | Hatsuda et al. | |
| 10,410,706 B2 | 9/2019 | Katayama et al. | |
| 10,453,512 B2 | 10/2019 | Katayama | |
| 10,892,000 B2 | 1/2021 | Katayama | |
| 2005/0047205 A1 | 3/2005 | Tsuchida | |
| 2015/0070971 A1 | 3/2015 | Katayama et al. | |
| 2015/0262640 A1 | 9/2015 | Katayama | |
| 2016/0078915 A1 | 3/2016 | Katayama | |
| 2018/0277188 A1 | 9/2018 | Fujino et al. | |
| 2019/0180808 A1 | 6/2019 | Yamada | |
| 2019/0295622 A1 * | 9/2019 | Katayama | G11C 11/1673 |

FOREIGN PATENT DOCUMENTS

| | | |
|---|---|---|
| JP | 3836823 B2 | 10/2006 |
| JP | 2015109120 A | 6/2015 |
| JP | 2019057348 A | 4/2019 |

* cited by examiner

*Primary Examiner* — J. H. Hur
(74) *Attorney, Agent, or Firm* — Holtz, Holtz & Volek PC

(57) ABSTRACT

According to one embodiment, a device includes a sense amplifier sensing a first signal based on first data in a cell and a second signal based on second data in the cell. The sense amplifier includes a current mirror causing a first current to flow in a first node connected to the cell and a second current in a second node based on a potential of the first node, a first switch connected to the second node and a third node, a transistor including a terminal connected to the second node and a gate connected to the third node, a second switch connected to the second node and a fourth node, and a circuit connected to the second and third node and causing a third current to flow in the second node based on a potential of the third node.

18 Claims, 27 Drawing Sheets

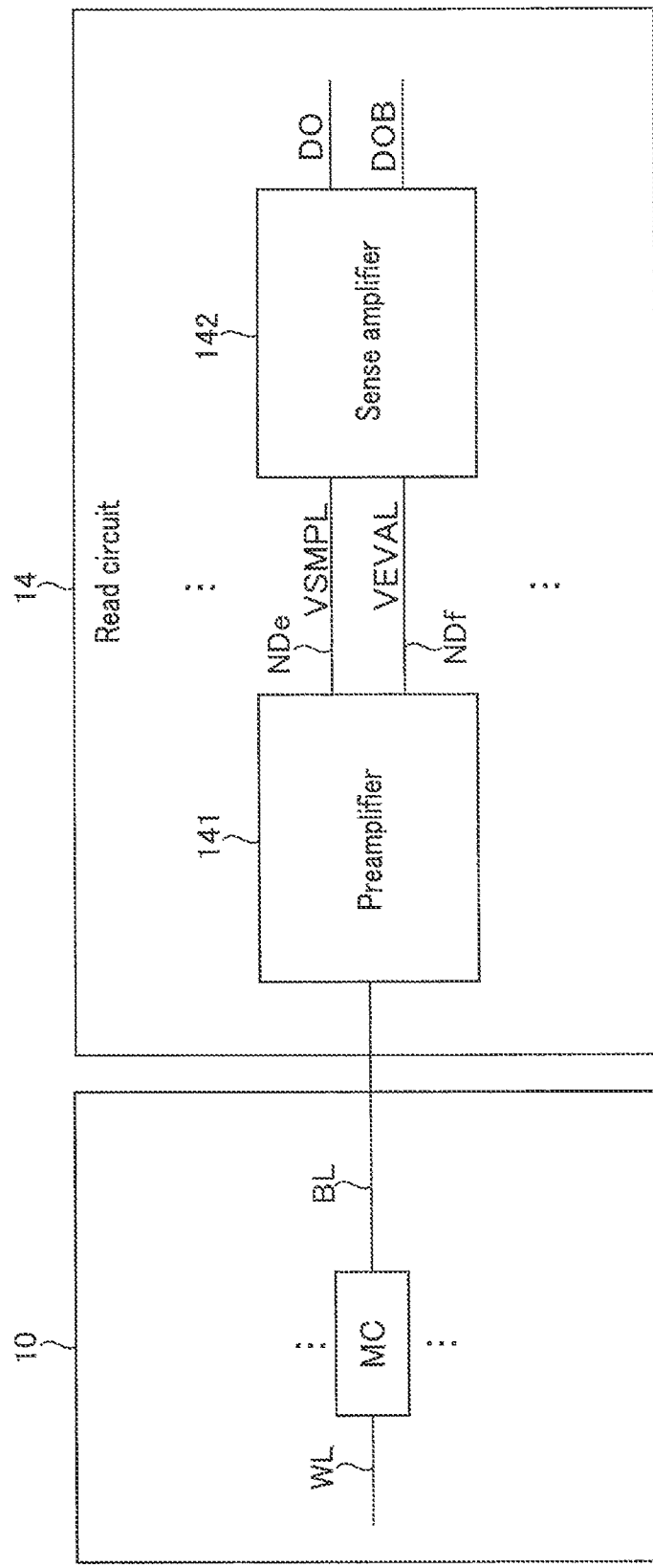
F I G. 6

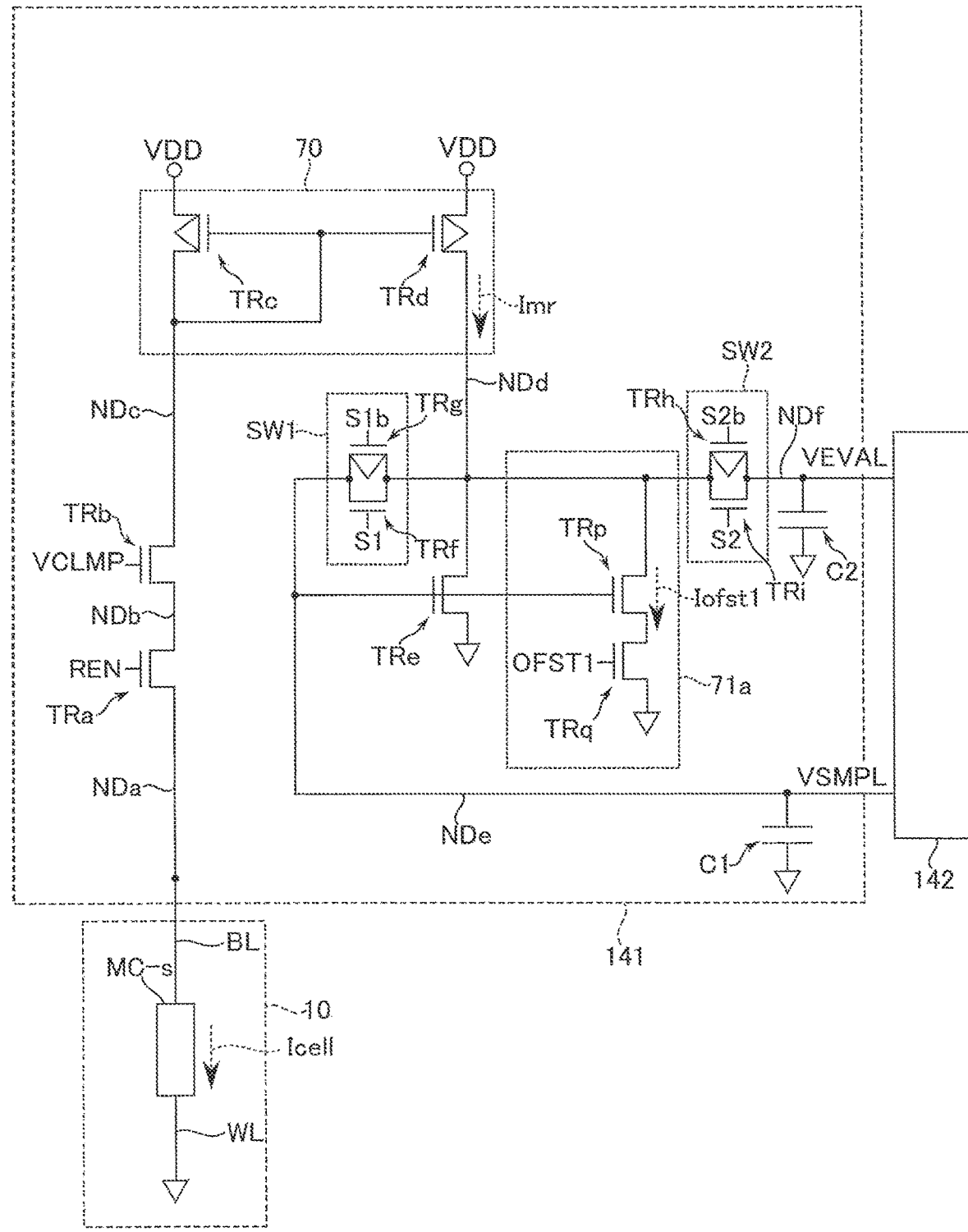
F I G. 8

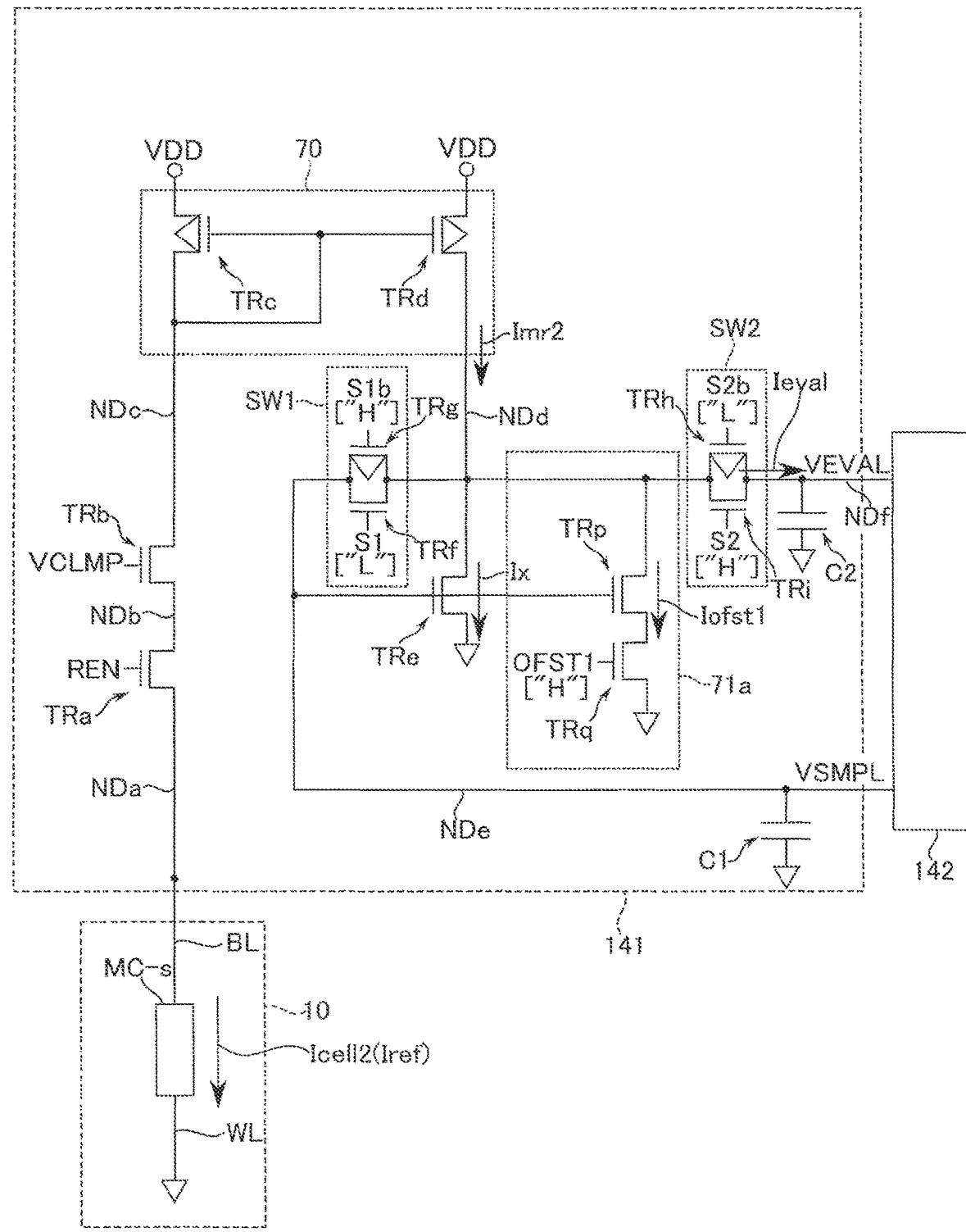
F I G. 12

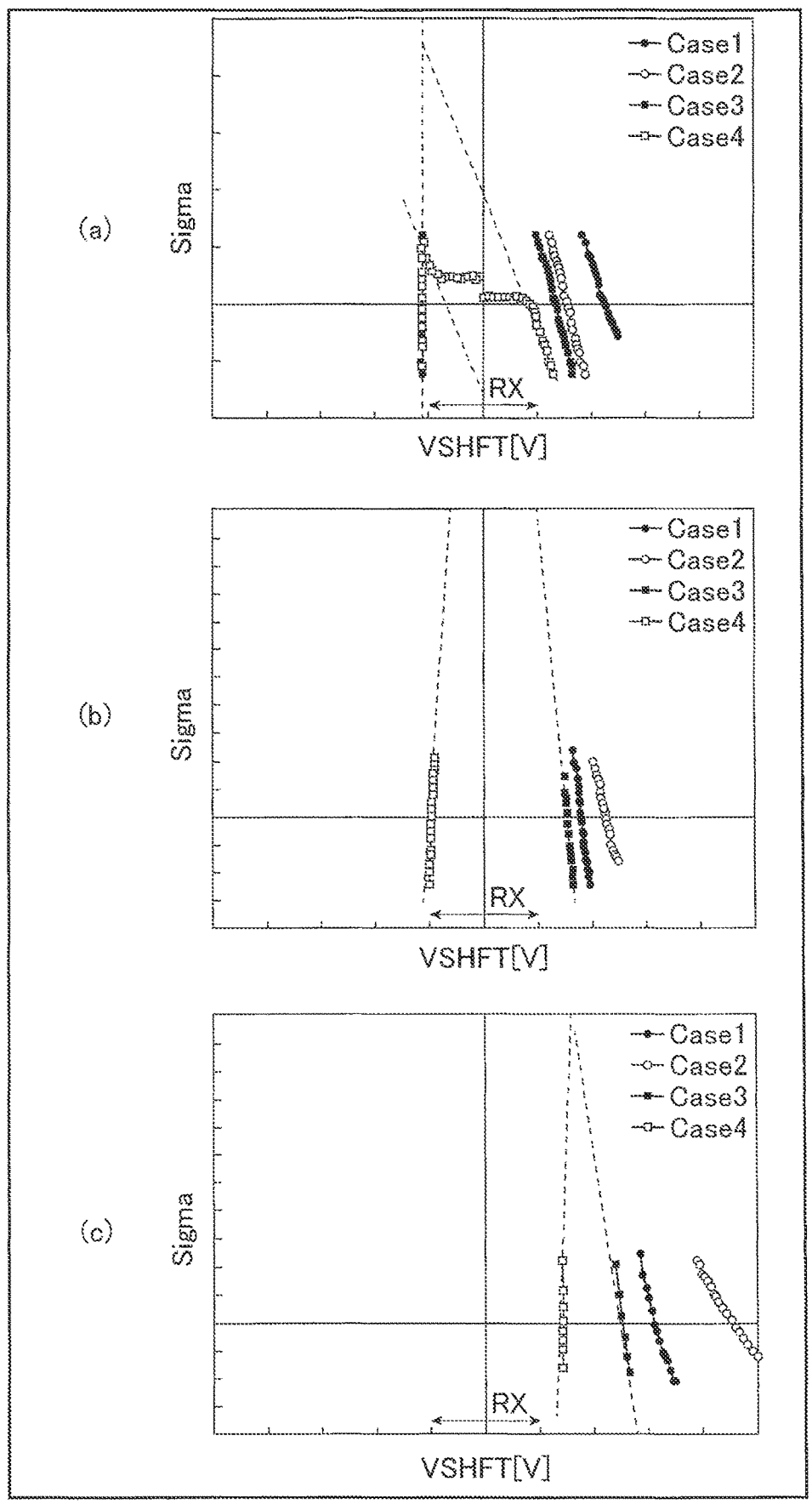
F I G. 16

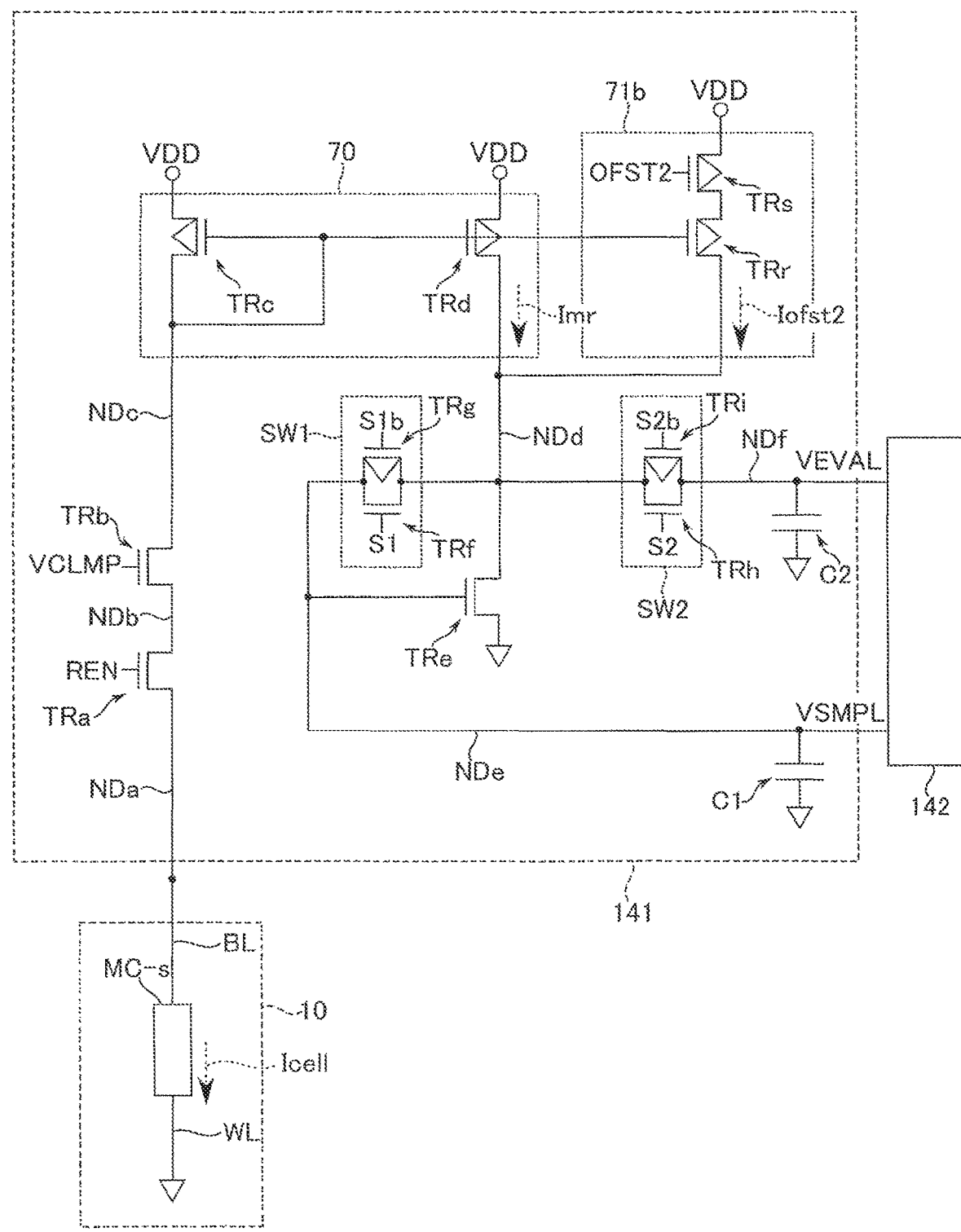
F I G. 17

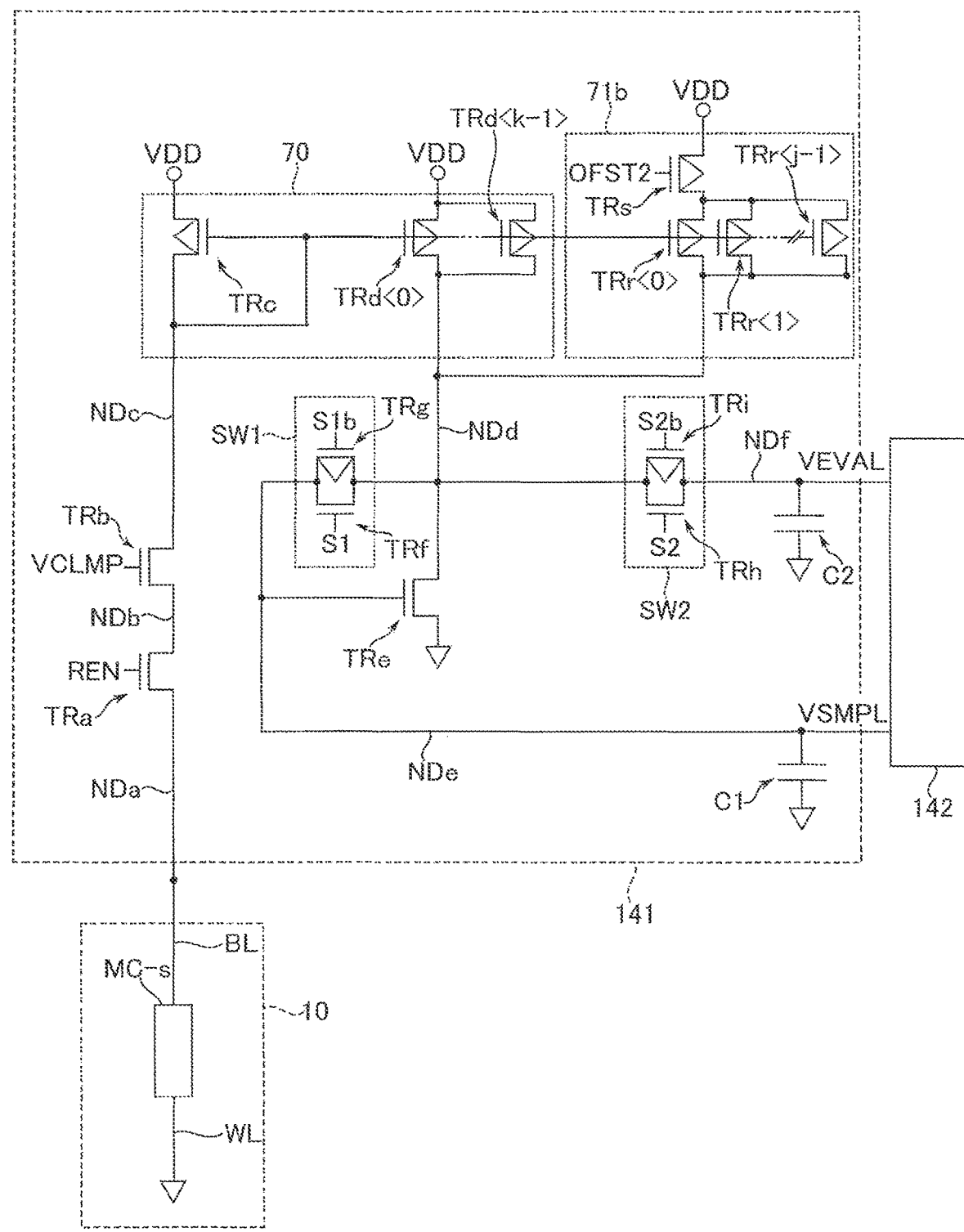
F I G. 26

MEMORY DEVICE THAT EXECUTES A READ OPERATION BASED ON A SELF-REFERENCE SCHEME

CROSS-REFERENCE TO RELATED APPLICATIONS

This application is based upon and claims the benefit of priority from Japanese Patent Application No. 2020-155568, filed Sep. 16, 2020, the entire contents of which are incorporated herein by reference.

FIELD

Embodiments described herein relate generally to a memory device.

BACKGROUND

A memory device using a variable resistance element (for example, a magnetoresistance effect element) as a memory element is known.

BRIEF DESCRIPTION OF THE DRAWINGS

FIG. 6 is a block diagram showing an example of the configuration of a read circuit of the memory device according to the first embodiment;

FIGS. 7 and 8 are equivalent circuit diagrams of the read circuit of the memory device according to the first embodiment;

FIGS. 11 and 12 are diagrams showing an example of the operation of the memory device according to the first embodiment;

FIGS. 13, 14, 15, and 16 are graphs showing the characteristics of the memory device according to the first embodiment;

FIG. 17 is an equivalent circuit diagram showing an example of the configuration of a memory device according to the second embodiment;

FIG. 26 is an equivalent circuit diagram showing an example of the configuration of a memory device according to the sixth embodiment.

DETAILED DESCRIPTION

Figure 1:
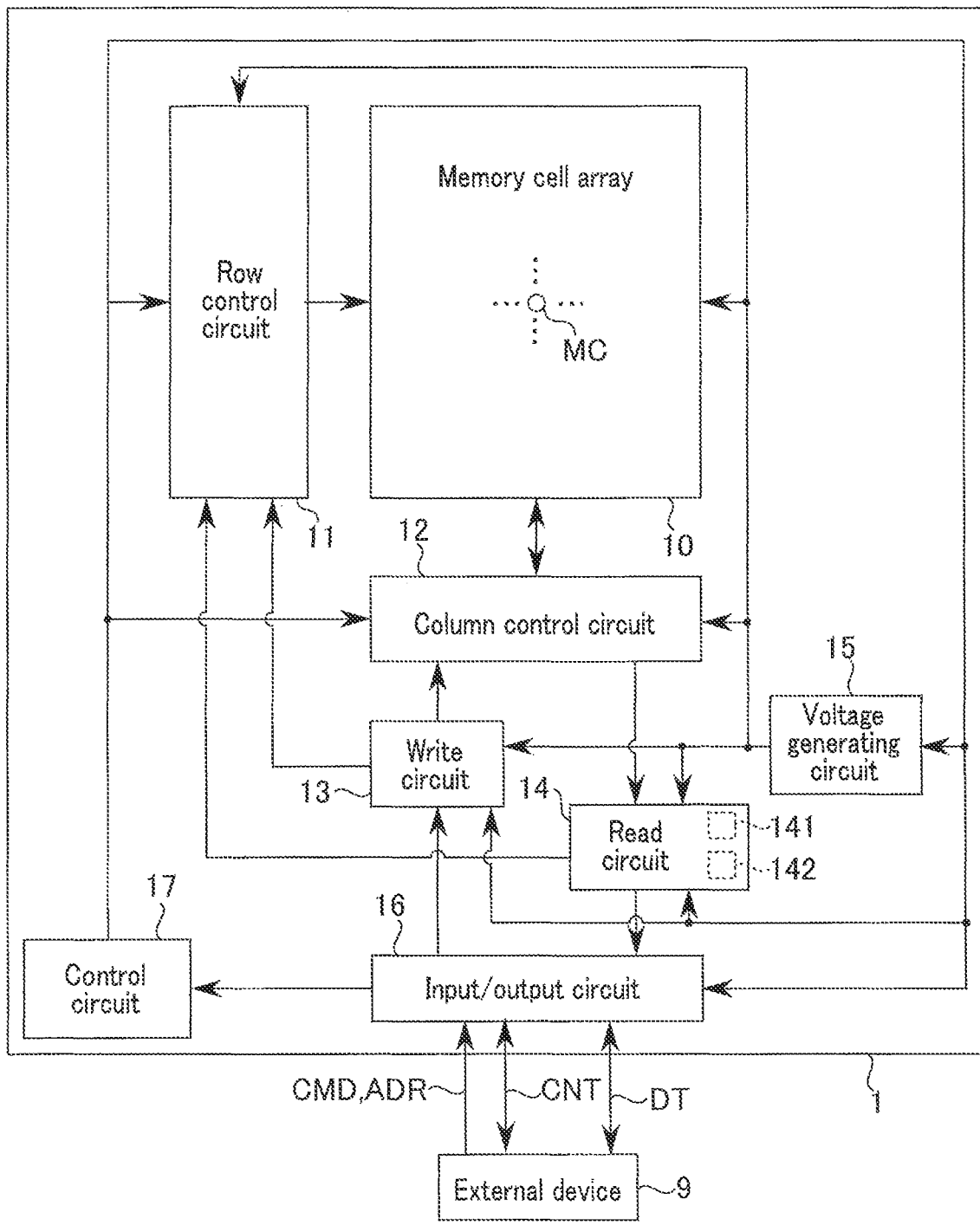
FIG. 1 is a block diagram showing an example of the configuration of a memory device according to the first embodiment.

Embodiments will be described below with reference to the accompanying drawings. Note that in the following description, constituent elements having the same functions and configurations are denoted by common reference numerals. In addition, a plurality of constituent elements having common reference numerals are discriminated by adding suffixes to the common reference numerals. Note that when there is no need to discriminate a plurality of constituent elements, the plurality of constituent elements are denoted by only common reference numerals without adding any suffixes. In this case, suffixes include indices, for example, added to the ends of common reference numerals to indicate arrays in addition to subscripts and superscripts.

In general, according to one embodiment, a memory device includes: a memory cell; and a read circuit configured to sense a first signal based on first data in the memory cell, write second data in the memory cell, sense a second signal based on the second data in the memory cell, and read data in the memory cell based on a comparison result between the first signal and the second signal. The read circuit includes a first sense amplifier configured to sense the first signal and the second signal, and the first sense amplifier includes a current mirror circuit configured to cause a first current to flow in a first node connected to the memory cell and cause a second current to flow in a second node based on a potential of the first node, a first switching element including a first terminal connected to the second node and a second terminal connected to a third node, a first transistor including a third terminal connected to the second node and a first gate connected to the third node, a second switching element including a fourth terminal connected to the second node and a fifth terminal connected to a fourth node, and a first circuit connected to the second node and the third node and configured to cause a third current to flow in the second node based on a potential of the third node.

(1) First Embodiment

A memory device according to the first embodiment will be described with reference to FIGS. 1, 2, 3, 4, 5, 6, 7, 8, 9, 10, 11, 12, 13 14, 15, and 16.

(1a) Configuration Example

An example of the configuration of the memory device according to this embodiment will be described with reference to FIGS. 1, 2, 3, 4, 5, 6, 7, and 8.

FIG. 1 is a block diagram showing an example of the configuration of the memory device according to this embodiment.

As shown in FIG. 1, for example, a memory device 1 is connected to a device (to be referred to as an external device hereinafter) 9 outside the memory device 1. The external device 9 sends a command CMD, an address ADR, and a control signal CNT to the memory device 1. At the time of writing, the external device 9 sends data (to be referred to as write data hereinafter) to be written in the memory device 1. At the time of reading, the external device 9, from the memory device 1, receives data (to be referred to as read data hereinafter) read out from the memory device 1.

The memory device 1 includes a memory cell array 10, a row control circuit 11, a column control circuit 12, a write circuit 13, a read circuit 14, a voltage generation circuit 15, an input/output circuit 16, and a control circuit 17.

The memory cell array 10 includes a plurality of memory cells MC, a plurality of word lines, and a plurality of bit lines.

Each of a plurality of memory cells is associated with a corresponding one of pairs of rows and columns. Each memory cell MC is connected to a corresponding one of a plurality of word lines WL. Each memory cell MC is connected to a corresponding one of a plurality of bit lines BL.

The row control circuit 11 is connected to the memory cell array 10 via the word lines WL. The row control circuit 11 receives a decoding result (row address) concerning a row of the address ADR. The row control circuit 11 controls the plurality of word lines WL based on the decoding result concerning the address ADR. With this operation, the row control circuit 11 sets the plurality of word lines WL (a plurality of rows) in the selected state and the non-selected state. In the following description, the word line WL set in the selected state is called the selected word line WL, and the word line WL other than the selected word line WL is called the non-selected word lines WL.

The column control circuit 12 is connected to the memory cell array 10 via the bit lines BL. The column control circuit 12 receives a decoding result (column address) concerning a column of the address ADR. The column control circuit 12 controls the plurality of bit lines BL based on the decoding result concerning the address ADR. With this operation, the column control circuit 12 sets the plurality of bit lines BL (a plurality of columns) in the selected state and the non-selected state. In the following description, the bit line BL set in the selected state is called the selected bit line BL, and the bit line BL other than the selected bit line BL is called the non-selected bit line BL.

The write circuit 13 writes data in the memory cell MC. The write circuit 13 includes, for example, a write driver (not shown).

The read circuit 14 reads data from the memory cell MC. The read circuit 14 includes, for example, a preamplifier 141 and a sense amplifier 142. The detailed configurations of the preamplifier 141 and the sense amplifier 142 will be described later.

The voltage generation circuit 15 generates voltages for various types of operations of the memory cell array 10 by using the power supply voltage provided from the external device 9. For example, the voltage generation circuit 15 generates various types of voltages used for write operations. The voltage generation circuit 15 outputs the generated voltages to the write circuit 13. For example, the voltage generation circuit 15 generates various types of voltages used for read operations. The voltage generation circuit 15 outputs the generated voltages to the read circuit 14.

The input/output circuit 16 functions as an interface circuit for the various types of signals ADR, CMD, CNT, and DT between the memory device 1 and the external device 9.

The input/output circuit 16 transfers the address ADR from the external device 9 to the control circuit 17. The input/output circuit 16 transfers the command CMD from the external device 9 to the control circuit 17. The input/output circuit 16 transfers various control signals CNT between the external device 9 and the control circuit 17. The input/output circuit 16 transfers the data DT from the external device 9 to the write circuit 13. The input/output circuit 16 transfers the data DT, transferred from the read circuit 14, to the external device 9.

The control circuit (also called a sequencer, state machine, or internal controller) 17 decodes the command CMD. The control circuit 17 controls the operations of the row control circuit 11, the column control circuit 12, the write circuit 13, the read circuit 14, the voltage generation circuit 15, and the input/output circuit 16 in the memory device 1 based on the decoding result of the command CMD, the control signal CNT, and the command CMD.

The control circuit 17 decodes the address APR. The control circuit 17 sends address decoding results to the row control circuit 11, the column control circuit 12, and the like. Note that a circuit (command decoder) for decoding commands and a circuit (address decoder) for decoding addresses may be provided outside the control circuit 17 in the memory device 1.

(1a-1) Example of Configuration of Memory Cell Array

Figure 2:
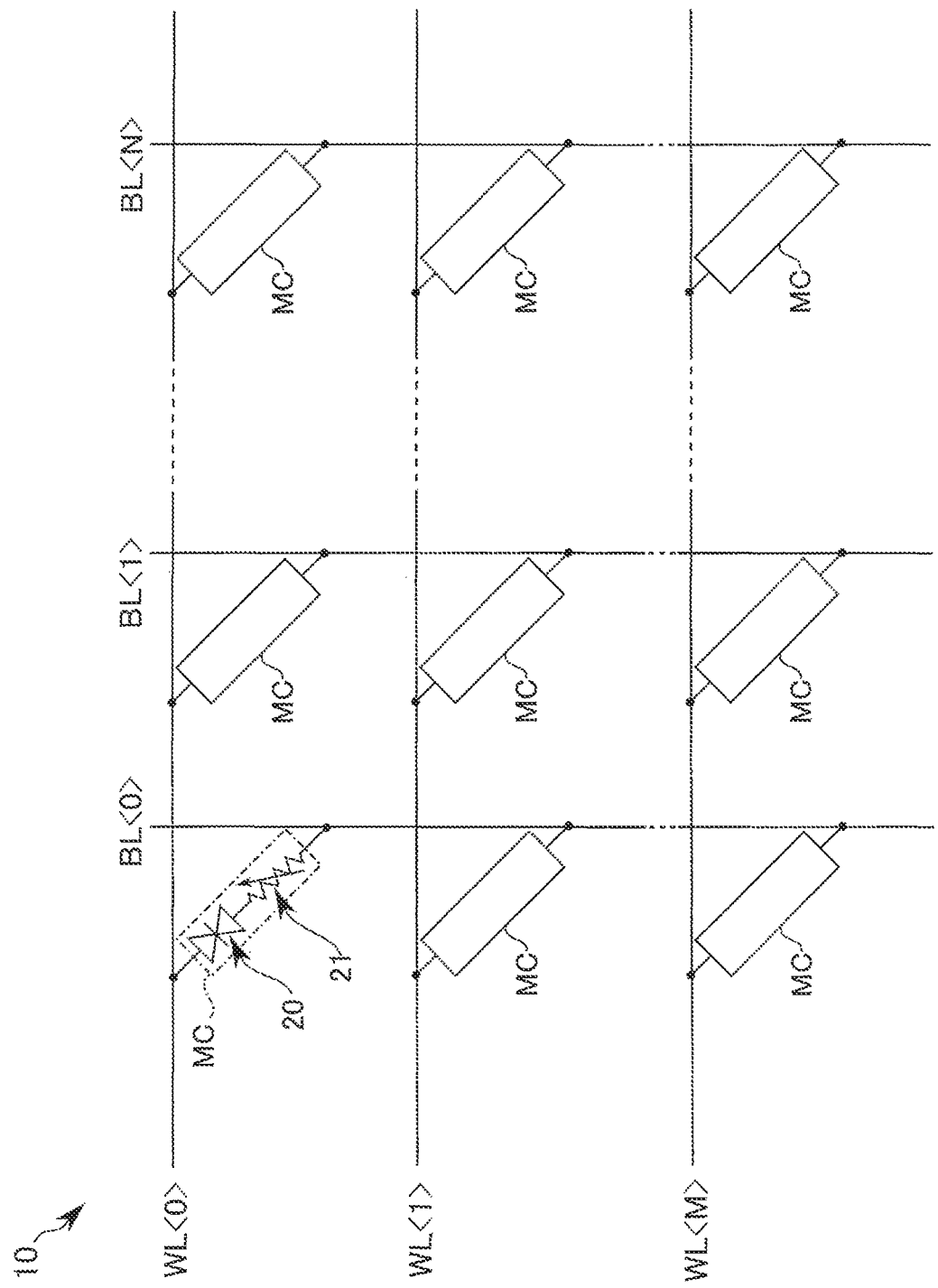
FIG. 2 is an equivalent circuit diagram of the memory cell array of the memory device according to the first embodiment.

FIG. 2 is an equivalent circuit diagram showing an example of the configuration of the memory cell array of the memory device according to this embodiment. Referring to FIG. 2, the word lines WL, the bit lines BL, and the memory cells MC are discriminated by suffixes (indices).

As shown in FIG. 2, the plurality of memory cells MC are arranged in a matrix pattern in the memory cell array 10. Each memory cell MC is connected to a corresponding one of the plurality of bit lines BL (BL<0>, BL<1>, . . . , BL<n−1>) and a corresponding one of the plurality of word lines WL (WL<0>, WL<1>, . . . , WL<m−1>). In this case, m and n are arbitrary integers. The memory cell MC<i, j> ($0 \leq i \leq m-1$, $0 \leq j \leq n-1$) is connected between the word line WL<1> and the bit line BL<j>.

Each memory cell MC includes a switching element 20 and a memory element (variable resistance element) 21.

At the time of writing and reading data to and from the corresponding memory element 21, the switching element 20 functions as a selected element that controls the supply of a current (or a voltage) to the memory element 21.

When, for example, the voltage applied to a given memory cell MC is lower than a threshold voltage Vth of the switching element 20 in the memory cell MC, the switching element 20 is set in the OFF state (the high resistance state or insulated state). In this case, the switching element 20 shuts off a current to the memory cell MC.

When the voltage applied to a given memory cell MC is equal to or higher than the threshold voltage Vth of the switching element 20 in the memory cell MC, the switching element 20 is set in the ON state (the low resistance state or conductive state). In this case, the switching element 20 causes a current to flow into the memory cell MC.

The switching element 20 has a function capable of switching whether to allow a current to flow to the memory cell MC in accordance with the magnitude of the voltage applied to the memory cell MC regardless of the flowing direction of the current.

The switching element 20 is, for example, a two-terminal element. The switching element 20 as a two-terminal element includes a layer provided between two terminals. The switching element 20 includes a layer (to be also referred to as a switching layer or resistance change layer) having function of switching between the resistance states of the layer.

When the voltage applied between the two terminals of the switching element 20 is lower than the threshold voltage of the switching element 20, the switching element 20 is in the high resistance state (OFF state). In this case, the switching element 20 is set in the electrically nonconductive state.

When the voltage applied between the two terminals of the switching element 20 is equal to or higher than the threshold voltage, the switching element 20 is in the low resistance state (ON state). In this case, the switching element 20 is set in the electrically nonconductive state.

The switching element 20 preferably has a switching function (characteristic) with respect to both polarities, i.e., the positive and negative polarities, of the voltage applied to the switching element 20. Note, however, that the switching element 20 may have a switching function (characteristic) with respect to at least one of the positive and negative polarities of the voltage applied to the switching element 20.

For example, the memory element 21 is a variable resistance element. The resistance state of the variable resistance element 21 changes to a plurality of resistance states (for example, the low resistance state and the high resistance state) depending on a current (or voltage) the supply of which is controlled by the switching element 20. The memory element 21 can store data by associating the resistance state of the element 21 with data (for example, "0" data and "1" data).

Figure 3:
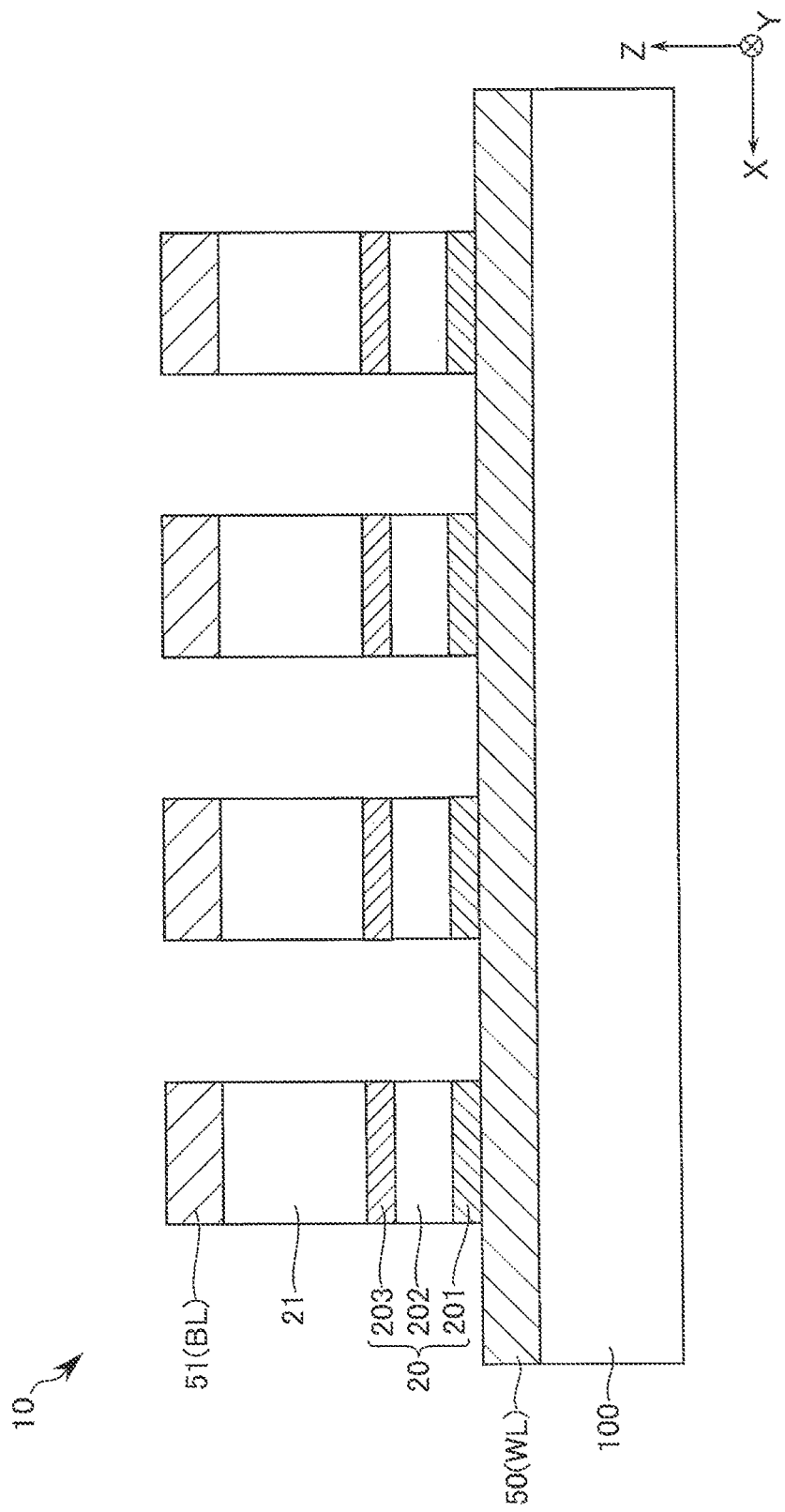
FIGS. 3 and 4 are sectional views each showing an example of the structure of the memory cell array of the memory device according to the first embodiment.
Figure 4:
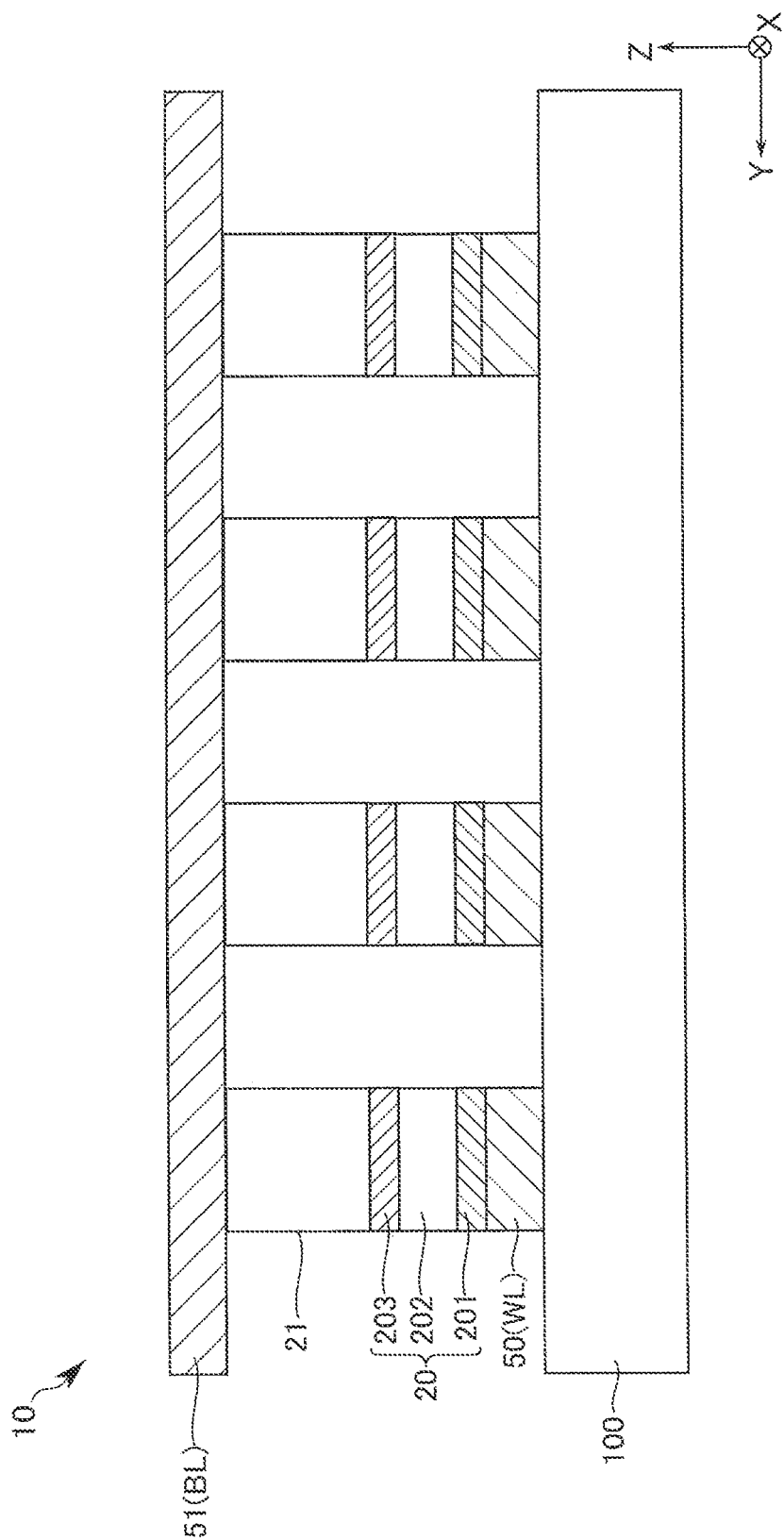

FIGS. 3 and 4 are used to explain an example of the structure of the memory cell array of the memory device according to this embodiment. FIG. 3 is a schematic sectional view showing a sectional structure of the memory array along the X direction. FIG. 4 is a schematic sectional view showing a sectional structure of the memory array along the Y direction.

As shown in FIGS. 3 and 4, the memory cell array 10 is provided above the upper surface of a substrate 100.

In the following description, assume that a plane parallel to the upper surface of the substrate 100 is defined as an X-Y plane, and a direction (axis) perpendicular to the X-Y plane is defined as a Z direction (Z-axis).

A plurality of conductive layers 50 are provided above the upper surface of the substrate 100 in the direction. The plurality of conductive layers 50 are arranged along the Y direction. Each conductive layer 50 extends along the X direction. The plurality of conductive layers 50 function as, for example, the word lines WL.

FIGS. 3 and 4 show a case in which the plurality of conductive layers 50 are in contact with the substrate 100. Note, however, that an insulating layer (not shown) may be provided between the plurality of conductive layers 50 and the substrate 100.

A plurality of conductive layers 51 are provided above the plurality of conductive layers 50 in the Z direction. The plurality of conductive layers 51 are arranged along the X direction. Each conductive layer 51 extends along the Y direction. The plurality of conductive layers 51 function as, for example, the bit lines BL.

The plurality of memory cells MC are provided between the plurality of conductive layers 50 and the plurality of conductive layers 51. The plurality of memory cells MC are arrayed in a matrix pattern in an X-Y plane.

The plurality of memory cells MC arranged in the X direction, are provided on one conductive layer 50. The plurality of memory cells MC arranged in the X direction are connected to the common word line WL.

The plurality of memory cells MC arranged in the Y direction are provided under one conductive layer 51. The plurality of memory cells MC arranged in the Y direction are connected to the common bit line BL.

For example, in each memory cell MC, the memory element (variable resistance element) 21 is provided on the switching element 20 in the Z direction. In this case, the switching element 20 is provided on the conductive layer (word line) 50. The conductive layer (bit line) 51 is provided on the variable resistance element 21.

Note that the configuration of the switching element 20 and the memory element 21 in the Z direction may be reversed to the arrangement shown in FIGS. 3 and 4. In this case, the element 20 is provided on the element 21.

The conductive layers 50 and the conductive layers 51 may be respectively used as the bit lines BL and the word lines WL in accordance with the memory cell array and the memory cell configuration.

The memory cell MC is a layer stack including the switching element 20 and the memory element 21.

The switching element 20 as a two-terminal element includes two electrodes 201 and 203 and a switching layer (resistance change layer) 202. The switching layer 202 is provided between the two electrodes 201 and 203 in the Z direction.

The memory element 21 is a variable resistance element. The variable resistance element 21 can have a plurality of resistance states (resistance values). The variable resistance element 21 is used as a memory element by associating the resistance state of the variable resistance element 21 with data (for example, 1-bit data).

For example, the memory element 21 is a magnetoresistance effect element. In this case, the memory device according to this embodiment is a magnetic memory like an MRAM (Magnetoresistive Random Access Memory).

<Magnetoresistance Effect Element>

An example of the configuration of a memory element (magnetoresistance effect element) of the memory device according to this embodiment will be described with reference to FIG. 5.

Figure 5:
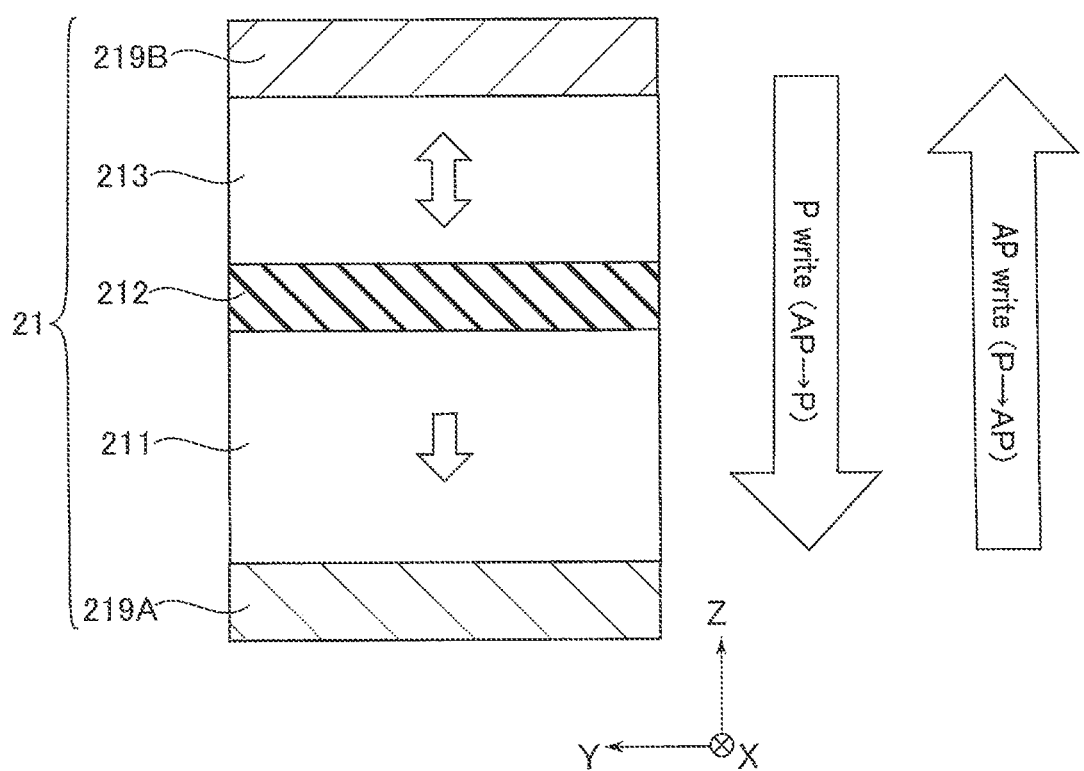
FIG. 5 is a view showing an example of the configuration of a memory element of the memory device according to the first embodiment.

FIG. 5 is a sectional view showing an example of the configuration of a magnetoresistance effect element. FIG. 5 shows, for example, an example of a section along a plane (for example, an X-Z plane) parallel to the Z direction of the memory element 21 shown in FIGS. 3 and 4.

For example, the magnetoresistance effect element 21 includes at least two magnetic layers 211 and 213 and a nonmagnetic layer 212. The nonmagnetic layer 212 is provided between the two magnetic layers 211 and 213 in the Z direction. For example, the plurality of layers, namely the magnetic layer 211, the nonmagnetic layer 212, and the magnetic layer 213, are stacked in this order from the word line WL side to the bit line BL side.

The two magnetic layers 211 and 213 and the nonmagnetic layer 212 arrayed in the Z direction form a magnetic tunnel junction (MTJ). In the following description, the magnetoresistance effect element 21 including the magnetic tunnel junction will be described by exemplifying the use of the MTJ element 21. The nonmagnetic layer 212 of the MTJ element 21 will be referred to as a tunnel barrier layer.

The magnetic layers 211 and 213 each are, for example, a ferromagnetic layer including cobalt, iron, and/or boron. The magnetic layers 211 and 213 each may be a single-layer film or multilayer film (for example, an artificial lattice film). The tunnel barrier layer 212 is, for example, an insulating film including magnesium oxide. The tunnel barrier layer may be a single-layer film or multilayer film.

For example, the magnetic layers 211 and 213 each have perpendicular magnetic anisotropy. The magnetization easy axis direction of each of the magnetic layers 211 and 213 is perpendicular to the layer surface (film surface) of each of the magnetic layers 211 and 213. The magnetization direction of each of the magnetic layers 211 and 213 is parallel to the array direction (Z direction) of the magnetic layers 211 and 213. The magnetic layers 211 and 213 each have magnetization perpendicular to the layer surface of each of the magnetic layers 211 and 213.

As described above, in this embodiment, the MTJ element 21 is a perpendicular magnetization type magnetoresistance effect element.

One of the two magnetic layers 211 and 213 has a variable magnetization direction, whereas the other magnetic layer has an invariable magnetization direction. The MTJ element 21 can have a plurality of resistance states (resistance values) in accordance with the relative relationship (to be referred to as a magnetization alignment hereinafter) between the magnetization direction of one magnetic layer and the magnetization direction of the other magnetic layer.

In the case shown in FIG. 5, the magnetic layer 213 has a variable magnetization direction. The magnetic layer 211 has an invariable (fixed) magnetization direction. In the following description, the magnetic layer 213 having a variable magnetization direction is called a storage layer. In the following description, the magnetic layer 211 having an invariable (fixed) magnetization direction is called a reference layer. Note that the storage layer 213 is sometimes called a free layer, magnetization free layer, or magnetization variable layer. The magnetic layer 211 is sometimes called a pin layer, pinned layer, magnetization invariable layer, or magnetization fixed layer.

In this embodiment, "the reference layer (magnetic layer) has an invariable magnetization direction" or "the reference layer (magnetic layer) has a fixed magnetization direction" means that when a current or voltage for changing the magnetization direction of the storage layer is supplied to the magnetoresistance effect element, the magnetization direction of the reference layer does not change regardless of the current or voltage supplied before or after the supply of a current/voltage.

For example, the MTJ element 21 includes two electrodes 219A and 219B. The magnetic layers 211 and 213 and the tunnel barrier layer 212 are provided between the two electrodes 219A and 219B in the Z direction. The reference layer 211 is provided between the electrode 219A and the tunnel barrier layer 212. The storage layer 213 is provided between the electrode 219B and the tunnel barrier layer 212.

For example, a shift cancel layer (not shown) may be provided in the MTJ element 21. The shift cancel layer is provided between the reference layer 211 and the electrode 219A. The shift cancel layer is a magnetic layer for mitigating the influence of a stray magnetic field from the reference layer 211.

The nonmagnetic layer (not shown) is provided between the shift cancel layer and the reference layer 211. The nonmagnetic layer is, for example, a metal layer such as an Ru layer.

The reference layer 211 is antiferromagnetically bonded to the shift cancel layer through a nonmagnetic layer. This makes the layer stack including the reference layer 211 and the shift cancel layer forms an SAF (synthetic antiferromagnetic) structure. In the SAF structure, the magnetization direction of the shift cancel layer is opposite to the magnetization direction of the reference layer 211. In the SAF structure, the magnetization direction of the reference layer 211 is set in the fixed state.

For example, the MTJ element 21 may include at least one of a foundation layer (not shown) and a cap layer (not shown). The foundation layer is provided between the magnetic layer (the reference layer in this case) 211 and the electrode 219A. The foundation layer is a nonmagnetic layer (for example, a conductive compound layer). The foundation layer is a layer for improving the characteristics (for example, the crystallinity and/or the magnetic characteristic) of the magnetic layer 211 in contact with the foundation layer. The cap layer is a nonmagnetic layer (for example, a conductive compound layer) between the magnetic layer (the storage layer in this case) 213 and the electrode 219B. The cap layer is a layer for improving the characteristics (for example, the crystallinity and the magnetic characteristic) of the magnetic layer 213 in contact with the cap layer. Note that the foundation layer and the cap layer may be regarded as the constituent elements of an electrode 219 (219A and 219B).

When the magnetization direction of the storage layer 213 is the same as the magnetization direction of the reference layer 211, the state of the magnetization alignment of the MTJ element 21 is a magnetization parallel state (to be referred to as a P state hereinafter). When the magnetization direction of the storage layer 213 is opposite to the magnetization direction of the reference layer 211, the state of the magnetization alignment of the MTJ element 21 is a magnetization antiparallel state (to be referred to as an AP state hereinafter).

An example of the relationship between the magnetization alignment state of the MTJ element 21 and the resistance value (magnetic resistance) of the MTJ element 21 is that the resistance value of the MTJ element 21 in the P state is lower than the resistance value of the MTJ element 21 in the AP state. In this case, the resistance state of the MTJ element in the P state corresponds to a low resistance state, and the resistance state of the MTJ element in the AP state corresponds to a high resistance state.

For example, "0" data is associated with the MTJ element 21 in the P state (low resistance state), and data is associated with the MTJ element 21 in the AP state (high resistance state). Note, however, that the manner of associating the magnetization alignment state (resistance state) of the MTJ element 21 with "1"/"0" data is not limited to the above case.

With these characteristics of the MTJ element 21, the MTJ element 21 functions as a memory element.

The writing of data to the memory cell MC using the MTJ element 21 is executed by controlling the magnetization direction of the storage layer 213 of the MTJ element 21. When data is written, the resistance state (resistance value) of the MTJ element 21 changes in accordance with the magnetization alignment state of the MTJ element 21.

When, for example, the magnetization direction of the storage layer 213 is switched by STT (Spin Transfer Torque), a write current IWR (IWR0, IWR1) is supplied to the MTJ element 21.

The change of the magnetization alignment state of the MTJ element 21 from the AP state to the P state or from the P state to the AP state is controlled in accordance with whether the write current IWR flows from the storage layer 213 to the reference layer 211 or from the reference layer 211 to the storage layer 213. The current value of the write current IWR is set to be smaller than the magnetization switching threshold of the reference layer 211 and equal to or larger than the magnetization switching threshold of the storage layer 213. Note that the magnetization switching threshold of the storage layer 213 is preferably larger than a threshold current for setting the switching element 20 in the low resistance state.

The write current IWR flowing in the MTJ element 21 generates a spin torque that contributes to the magnetization switching of the storage layer 213. The generated spin torque is applied to the storage layer 213.

When the magnetization alignment state of the MTJ element 21 changes from the AP state to the P state (which will be also referred to as P write hereinafter), the write current IWR0 flowing from the storage layer 213 to the reference layer 211 is supplied to the MTJ element 21. This applies the spin torque of spins (electrons) in the same direction as the magnetization direction of the reference layer 211 to the magnetization of the storage layer 213. When the magnetization direction of the storage layer 213 is opposite to the magnetization direction of the reference layer 211, the magnetization direction of the storage 213 is changed to the same direction as the magnetization direction of the reference layer 211 by the applied spin torque.

As a result, the magnetization alignment state of the MTJ element 21 is set to the P state. In this case, the MTJ element 21 holds "0" data.

When the magnetization alignment state of the MTJ element 21 changes from the P state to the AP state (which is also referred to as AP write hereinafter), the write current IWR1 flowing from the reference layer 211 to the storage layer 213 is supplied to the MTJ element 21. This applies the spin torque of spins in a direction opposite to the magnetization direction of the reference layer 211 to the magnetization of the storage layer 213. When the magnetization direction of the storage layer 213 is the same as the magnetization direction of the reference layer 211, the magnetization direction of the storage layer 213 is changed to a direction opposite to the magnetization direction of the reference layer 211 by the applied spin torque.

As a result, the magnetization alignment state of the MTJ element 21 is set to the AP state. In this case, the MTJ element 21 holds "1" data.

Data is read from the memory cell MC by discriminating the magnetization alignment state (resistance value) of the MTJ element 21. At the time of data read, a current flows in the MTJ element 21 in accordance with the application of a voltage, to the memory cell MC. The current value of a current at the time of data read is set to a value smaller than the magnetization switching threshold of the storage layer 213.

The resistance value (magnetization alignment state) of the MTJ element 21 is equivalently discriminated based on the magnitude of an output signal (for example, a current or voltage) from the MTJ element 21 at the time of the application of a voltage to the memory cell MC.

With this operation, data in the memory cell MC is discriminated and read.

In this embodiment, a read operation is executed based on a self-reference scheme. The read operation based on the self-reference scheme will be described in detail later.

(a-2) Configuration of Read Circuit

An example of the configuration of the read circuit of the memory device (for example, an MRAM) according to this embodiment will be described with reference to FIGS. 6, 7, and 8.

FIG. 6 is a block diagram for explaining the configuration of the read circuit of the MRAM according to this embodiment.

As shown in FIG. 6, the read circuit 14 includes one or more preamplifiers (also called pre-stage sense amplifier circuits) 141 and one or more sense amplifiers (also called post-stage sense amplifier circuits) 142.

The preamplifier 141 and the sense amplifier 142 are, for example, made to correspond to the bit line BL (column). One pair of one preamplifier 141 and one sense amplifier 142 is provided for one bit line BL. Note that a pair of the preamplifier 141 and the sense amplifier 142 may be provided for a set of two or more bit lines BL.

The preamplifier 141 is connected to the memory cell MC via the corresponding bit line BL. The preamplifier 141 can sense a signal based on data in the memory cell MC.

The preamplifier 141 is connected to the corresponding sense amplifier 142 via nodes NDe and NDf. Note that each node is a constituent element including an interconnect, a contact point, and a terminal.

The preamplifier 141 senses and amplifies a plurality of signals (voltages or currents) from the memory cell MC. The preamplifier 141 holds the sensed and amplified signals in the nodes NDe and NDf.

The sense amplifier 142 senses signals (voltages or currents) supplied to the nodes NDe and NDf and amplifies the sensed signals.

The sense amplifier 142 discriminates data in the memory cell MC based on the sensed and amplified signal. The data in the memory cell MC is output as signals DO and DOB to outside the read circuit 14.

As described above, the read circuit 14 reads the data in the memory cell MC (memory cell array) using the preamplifier 141 and the sense amplifier 142.

<Sense Amplifier>

An example of the configuration of the sense amplifier (post-stage sense amplifier circuit) of the memory device according to this embodiment will be described with reference to FIG. 7.

Figure 7:
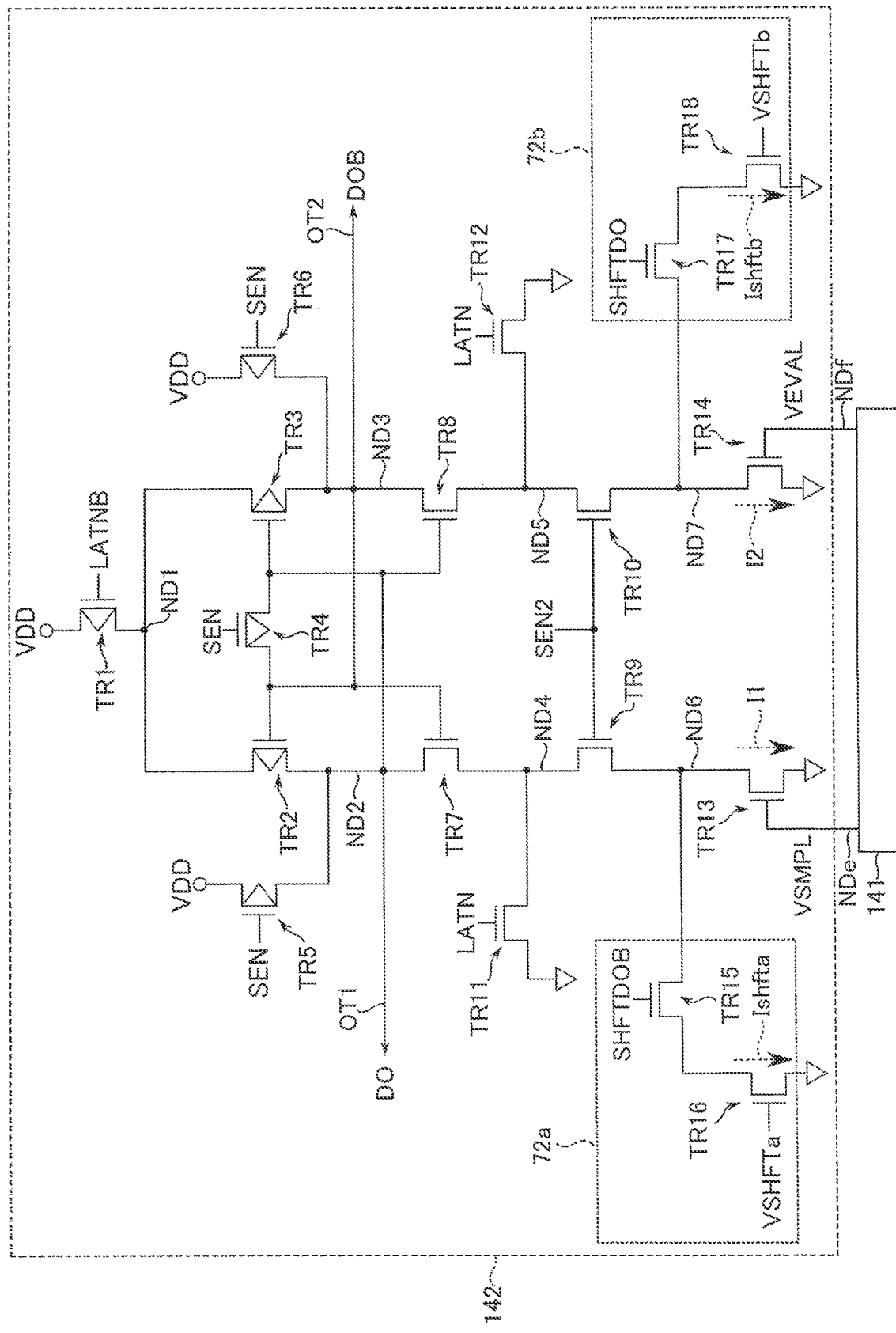

FIG. 7 is a circuit diagram for explaining the configuration of the sense amplifier of the memory device according to this embodiment. As shown in FIG. 7, the sense amplifier 142 includes a plurality of transistors TR1 to TR18.

The transistors TR1, TR2, TR3, TR4, TR5, and TR6 are, for example, field-effect transistors having p-type conductivity (for example, MOS transistors). The transistors TR7, TR8, TR9, TR10, TR11, TR12, TR13, TR14, TR15, TR16, TR17, and TR18 are, for example, field-effect transistors having n-type conductivity (for example, MOS transistors).

Each of the transistors TR1 to TR18 includes a plurality of terminals (for example, a source and a drain) and a gate.

One terminal (one of the source and the drain) of the transistor TR1 is connected to the terminal to which a voltage (for example, a power supply voltage) VDD is applied. The voltage VDD is supplied to one terminal (one of the source and the drain) of the transistor TR1. The terminal (or a node) to which the power supply voltage VDD is applied will be denoted as the power supply terminal (or the power supply node) VDD hereinafter.

The other terminal (the other of the source and the drain) of the transistor TR1 is connected to a node ND1.

A signal LATNB is supplied to the gate of the transistor TR1. The signal LATNB is, for example, an inverted signal of a signal LATN (to be described later).

One terminal of the transistor TR2 is connected to the node ND1. The other terminal of the transistor TR2 is connected to a node ND2. The gate of the transistor TR2 is connected to a node ND3.

One terminal of the transistor TR3 is connected to the node ND1. The other terminal of the transistor TR2 is connected to the node ND3. The gate of the transistor TR3 is connected the node ND2.

One terminal of the transistor TR4 is connected to the node ND3. The other terminal of the transistor TR4 is connected to the node ND2. A signal SEN is supplied to the gate of the transistor TR4. The signal SEN is for example, a signal indicating the start (the activation of the sense amplifier 142) of the processing of sensing the voltage supplied to the nodes NDe and NDf (which will be referred to as sense processing hereinafter).

One terminal of the transistor TR5 is connected to the power supply terminal VDD. The power supply voltage VDD is supplied to one terminal of the transistor TR5. The other terminal of the transistor TR5 is connected to the node ND2. The signal SEN is supplied to the gate of the transistor TR5.

One terminal of the transistor TR6 is connected to the voltage terminal VDD. The power supply voltage VDD is supplied to one terminal of the transistor TR6. The other terminal of the transistor TR6 is connected to the node ND3. The signal SEN is supplied to the gate of the transistor TR6.

One terminal of the transistor TR7 is connected to the node ND2. The other terminal of the transistor TR7 is connected to a node ND4. The gate of the transistor TR7 is connected to the node ND3.

One terminal of the transistor TR8 is connected to the node ND3. The other terminal of the transistor TR8 is connected to a node ND5. The gate of the transistor TR8 is connected to the node ND2.

One terminal of the transistor TR9 is connected to the node ND4. The other terminal of the transistor TR9 is connected to a terminal to which a ground voltage VSS is applied. The ground voltage VSS is supplied to one terminal of the transistor TR9. The terminal (or a node) to which the ground voltage VSS is applied will be denoted as the ground terminal (or the ground node) VSS hereinafter. The signal LATN is supplied to the gate of the transistor TR9. The signal LATN is, for example, a signal indicating the end of sense processing.

One terminal of the transistor TR10 is connected to the node ND5. The other terminal of the transistor TR10 is connected to the ground terminal VSS. The signal LATN is supplied to the gate of the transistor TR10.

One terminal of the transistor TR11 is connected to the node ND4. The other terminal of the transistor TR11 is connected to a node ND6. A signal SEN2 is supplied to the gate of the transistor TR11. The signal SEN2 is, for example, a signal indicating the start of sense processing, together with the signal SEN.

One terminal of the transistor TR12 is connected to the node ND5. The other terminal of the transistor TR12 is connected to a node ND7. The signal SEN2 is supplied to the gate of the transistor TR11.

One terminal of the transistor TR13 is connected to the node ND6. The other terminal of the transistor TR13 is connected to the ground terminal VSS. The ground voltage VSS is supplied to the other terminal of the transistor TR13. The gate of the transistor TR13 is connected to the node NDe. A signal (voltage) VSMPL from the preamplifier 141 is supplied to the gate of the transistor TR13 via the node NDe. The gate of the transistor TR13 becomes one input terminal of the sense amplifier 142. The transistor TR13 functions as an input portion for a signal (voltage VSMPL) from the preamplifier 141 to the sense amplifier 142.

One terminal of the transistor TR14 is connected to the node ND7. The other terminal of the transistor TR14 is connected to the ground terminal VSS. The ground voltage VSS is supplied to the other terminal of the transistor TR14. The gate of the transistor TR14 is connected to the node NDf. A signal (voltage) VEVAL from the preamplifier 141 is supplied to the gate of the transistor TR14 via the node NDf. The gate of the transistor TR14 becomes the other input terminal (input portion) of the sense amplifier 142. The transistor TR14 functions as an input unit for a signal (voltage VEVAL) from the preamplifier 141 to the sense amplifier 142.

One terminal of the transistor TR15 is connected to the node ND6. The other terminal of the transistor TR15 is connected to one terminal of the transistor TR16. A signal SHETDOB is supplied to the gate of the transistor TR15. The signal SHFTDOB is, for example, a signal indicating whether the sense amplifier 142 senses a value corresponding to the voltage VSMPL of the node NDe by offsetting (biasing) the value.

The other terminal of the transistor TR16 is connected to the ground terminal VSS. A voltage VSHFTa is supplied to the gate of the transistor TR16. The voltage VSHFTa is, for example, a signal voltage indicating the offset value (bias amount) of the voltage VSMPL (or a value corresponding to the voltage VSMPL) of the node NDe.

One terminal of the transistor TR17 is connected to the node ND7. The other terminal of the transistor TR17 is connected to one terminal of the transistor TR18. A signal SHFTDO is supplied to the gate of the transistor TR17. The signal SHFTDO is an inverted signal of the signal SHFTDO. The signal SHFTDO is, for example, a signal indicating whether the sense amplifier 142 senses the voltage VEVAL (or a value corresponding to the voltage VEVAL) of the node NDf by offsetting (biasing) the value.

The other terminal of the transistor TR18 is connected to the ground terminal VSS. A voltage VSHFTb is supplied to the gate of the transistor TR18.

The voltage VSHFTb is a voltage indicating the offset value of a value corresponding to the voltage VEVAL of the node NDf.

An output terminal OT1 of the sense amplifier 142 is connected to the node ND2. The signal DO is output from the output terminal OT1 to outside the sense amplifier 142.

An output terminal OT2 of the sense amplifier 142 is connected to the node ND3. The signal DOB is output from the output terminal OT2 to outside the sense amplifier 142. The signal DOB is an inverted signal of the signal DO.

In this embodiment, the transistors TR15 and TR16 function as an offset circuit 72a.

The offset circuit 72a including the transistors TR15 and TR16 adds a given offset value (offset current) to an output (current) from the transistor TR13 in accordance with the voltage VSMPL of the node NDe. This makes it possible to equivalently offset the value of the voltage VSMPL in the sense amplifier 142. The offset amount to be added by the offset circuit 72a is set in accordance with the voltage value of a signal VSHFT.

In this embodiment, the transistors TR17 and TR18 function as an offset circuit 72b.

The offset circuit 72b including the transistors TR17 and TR18 adds a given offset value to an output (current) from the transistor TR14 which corresponds to the voltage VEVAL of the node NDf. This makes it possible to equivalently offset the value of the voltage VEVAL in the sense amplifier 142. The offset amount to be added by the offset circuit 72b is set in accordance with the voltage value of the signal VSHFT.

The sense amplifier 142 in FIG. 7 can compare the magnitude of the voltage VSMPL of the node NDe with the magnitude of the voltage VEVAL of the node NDf.

The sense amplifier 142 can output the signals based on the comparison result as the signals DO and DOB to the output terminals OT1 and OT2, respectively.

<Preamplifier>

An example of the configuration of the preamplifier (pre-stage sense amplifier circuit) of the memory device according to this embodiment will be described with reference to FIG. 8.

FIG. 8 is a circuit diagram for explaining an example of the configuration of the preamplifier of the MRAN according to this embodiment.

With the configuration in FIG. 8, the preamplifier 141 can sense, amplify, and hold a signal from the memory cell MC based on data in a memory cell (the resistance state of the MTJ element) as a sense result.

As shown in FIG. 8, the sense amplifier 142 includes a plurality of transistors TRa, TRb, TRc, TRd, TRe, TRf, TRg, TRh, TRi, TRp, and TRq. The transistors TRa, TRb, TRe, TRf, TRh, TRp, and TRq are, for example, field-effect transistors having n-type conductivity (for example, MOS transistors). The transistors TRc, TRd, TRq, and TRi are, for example, field-effect transistors having p-type conductivity (for example, MOS transistors).

Each of the transistors TRa, TRb, TRc, TRd, TRe, TRf, TRg, TRh, TRi, TRp, and TRq includes a plurality of terminals (a source and a drain) and a gate.

One terminal of the transistor TRa is connected to the bit line BL via a node NDa. The other terminal of the transistor TRa is connected to a node NDb. A signal REN is supplied to the gate of the transistor TRa. The signal REN is, for example, a signal indicating the start and end of a data read operation from the memory cell MC.

One terminal of the transistor TRb is connected to the node NDb. The other terminal of the transistor TRb is connected to a node NDc. A signal VCLMP is supplied to the gate of the transistor TRb. The signal VCLMP is, for example, a signal for adjusting (clamping) the voltage applied to the memory cell MC via the transistors TRa and TRb to a predetermined magnitude.

One terminal of the transistor TRc is connected to the node NDc. The other terminal of the transistor TRc is connected to the power supply terminal VDD. The gate of the transistor TRc is connected to the node NDc.

One terminal of the transistor TRd is connected to the power supply terminal VDD. The other terminal of the transistor TRd is connected to a node NDd. The gate of the transistor TRd is connected to the node NDc.

The transistors TRc and TRd function as a current mirror circuit 70. The current mirror circuit 70 including transistors TRc and TRd is configured to cause a current (to be also referred to as a mirror current or copy current hereinafter) Imr corresponding to a current (to be also referred to as a cell current hereinafter) flowing in the memory cell MC to flow in the node NDd when a read operation is executed.

The current ratio between the mirror current Imr in the current mirror circuit 70 and the cell current Icell is set in accordance with the ratio between the gate sizes (for example, gate widths) of the two transistors TRc and TRd. In this embodiment, for example, the gate width of the transistor TRd is set to substantially the same gate width as that of the transistor TRc. In this case, the magnitude of the mirror current Imr is substantially the same as that of the cell current.

One terminal of the transistor TRe is connected to the node NDd. The other terminal of the transistor TRe is connected to the ground terminal VSS. The gate of the transistor TRe is connected to the node NDe. When the transistors TRg and TRf (to be described later) are in the ON state, the gate of the transistor TRe is electrically connected to the node NDd (and one terminal of the transistor TRe) via the transistors TRg and TRf in the ON state. In this case, the transistor TRe is diode-connected to the node NDd. The transistor TRe will also be referred to as the diode-connected transistor TRe.

One terminal of the transistor TRf is connected to the node NDd. The other terminal of the transistor TRf is connected to the node NDe. A signal S1 is supplied to the gate of the transistor TRf.

One terminal of the transistor TRg is connected to the node NDd. The other terminal of the transistor TRg is connected to the node NDe. A signal S1b is supplied to the gate of the transistor TRg. The signal S1b an inverted signal of the signal S1.

The transistors TRg and TRf function as a MOS switch (switching element) SW1. The MOS switch SW1 controls electrical connection and disconnection between the node NDd and the node NDe. The transistors TRg and TRf can be controlled to be simultaneously set in the ON state or the OFF state by the signals S1 and S1b having a complementary relationship.

One terminal of the transistor TRh is connected to the node NDd. The other terminal of the transistor TRh is connected to a node NDf. A signal S2 is supplied to the gate of the transistor TRf.

One terminal of the transistor TRi is connected to the node NDd. The other terminal of the transistor TRi is connected to the node NDf. A signal S2b is supplied to the gate of the transistor TRi. The signal S2b is an inverted signal of the signal S2.

The transistors TRh and TRi function as a MOS switch SW2. The MOS switch SW2 controls electrical connection and disconnection between the node NDd and the node NDf. The transistors TRh and TRi can be controlled to be simultaneously set in the ON state or OFF state by the signals S2 and S2b having a complementary relationship.

The nodes NDe and NDf function as the output terminals of the preamplifier 141.

The node NDe is connected to the gate (one input terminal of the sense amplifier 142) of the transistor TR13 of the sense amplifier 142 (described above). The node NDe includes a capacitance component C1. For example, the capacitance component C1 is the interconnect capacitance (the parasitic capacitance of the interconnect and the terminal) of the node NDe. The magnitude of the capacitance component C1 (and the charging time of the capacitance component C1) is set such that the transistors TRe and TR13 can be driven by the voltage held in the capacitance component C1 (for example, the charged voltage of the node NDe).

The node NDf is connected to the gate of the transistor TR14 of the sense amplifier 142 described above (the other input terminal of the sense amplifier 142). The node NDf includes a capacitance component C2. For example, the capacitance component C2 is the interconnect capacitance (the parasitic capacitance of the interconnect and the terminal) of the node NDf. The magnitude of the capacitance component C2 (and the charging time of the capacitance component C2) is set such that the transistor TR14 can be driven by the voltage held in the capacitance component C2 (for example, the charged voltage of the node NDf).

Note that each of the capacitance components C1 and C2 is not limited to the interconnect capacitance of the node, and may be an element (for example, a capacitor) connected to the node NDe or NDf.

Each of the nodes NDe and NDf can hold the signal sensed by the capacitance component C1 or C2.

The node NDe can hold a sense result on the cell current Icell at the time of the first processing with the capacitance component C1. For example, the node NDe is charged with the current supplied to the node NDe. This causes the node NDe to hold the voltage VSMPL in the capacitance component C1 as a sense result.

The node NDf can hold a sense result on the cell current Icell a the time of the second processing executed after the first processing with the capacitance component C2. For example, the node NDf is charged with the current supplied to the node NDf. This causes the node NDf to hold the voltage VEVAL in the capacitance component C2 as a sense result.

In an MRAM 1 according to this embodiment, the preamplifier 141 includes an offset circuit 71a. In the embodiment, the preamplifier 141 can control the current driving force of the diode-connected transistor TRe by using the offset circuit 71a.

The offset circuit 71a is connected to the node NDd, the node NDe, and the ground terminal VSS.

The offset circuit 71a includes the transistors TRp and TRq.

One terminal of the transistor TRp is connected to the node NDd. The other terminal of the transistor TRp is connected to one terminal of the transistor TRq. The other terminal of the transistor TRq is connected to the ground terminal VSS. The gate of the transistor TRp is connected, to the node NDe (and the gate of the transistor TRe). A signal OFST1 is supplied to the gate of the transistor TRq.

The offset circuit 71a is activated or inactivated in accordance with the signal level of the signal OFST1. The transistor TRq is on-off controlled in accordance with the signal level of the signal OFST1.

The offset circuit 71a adds an offset value of a given magnitude to the mirror current Imr based on the cell current Icell in a selected cell MC-s to offset the sense result obtained by the preamplifier 141. The offset circuit 71a causes an offset current Iofst1 to flow from the node NDd to the ground terminal VSS to add an offset value to the current Imr.

In the offset circuit 71a in the activated state, the offset current Iofst1 flows from the node NDd to the ground terminal VSS via the current paths (channels) of the transistors TRp and TRq.

When an offset circuit 71 is set in the activated state, the signal level of the signal OFST1 is set at "H" level. The transistor TRq is set in the ON state by the "H"-level signal OFST1. The transistor TRq in the ON state electrically connects the transistor TRp to the ground terminal VSS. In this case, the offset current Iofst1 flows in the current paths of the transistors TRp and TRq.

The offset circuit 71a draws the current Iofst1 from the node NDd to the ground terminal VSS.

When the offset circuit 71a is set in the inactivated state, the signal level of the signal OFST1 is set at "L" level. The "L"-level signal OFST1 sets the transistor TRq in the OFF state. The transistor TRq in the OFF state electrically disconnects the transistor TRp from the ground terminal. In this case, the offset current Iofst1 does not flow in the current paths of the transistors TRp and TRq.

For example, the current value of the offset current Iofst1 is smaller than the current value of the mirror current (the current output from the transistor TRd) Imr. The magnitude of the current value of the offset current Iofst1 is set in accordance with the current driving force of the transistor TRp.

The current driving force of the transistor TRp can be set in accordance with the gate size of the transistor TRp (the gate width of the transistor TRp). The gate width of the transistor TRp is smaller than the gate width of the transistor TRe. For example, the gate width of the transistor TRp is set to about 0.1 times to 0.2 times the gate width of the transistor TRe. In this case, the current value of the offset current Iofst1 is about 0.1 times to 0.2 times the current value the current Imr output from the transistor TRd.

In this manner, the upper limit of the current value of the offset current Iofst1 is set based on the gate size of the transistor TRp.

The current value of the offset current Iofst1 changes in accordance with the potential of the node NDe which is applied to the gate of the transistor TRp, with the current value based on the gate size of the transistor TRp being the upper limit.

In this manner, in this embodiment, the offset circuit 71a can increase the driving force of the transistor (diode-connected transistor) TRe.

The above configuration allows the preamplifier 141 to respectively hold a plurality of signals (voltages) respectively corresponding to a plurality of cell currents in a given memory cell MC in the node NDe and the node NDf at the time of a read operation based on the self-reference scheme (to be described later).

The potential of the node NDe corresponds to the cell current Icell in the memory cell MC and the mirror current Imr in the preamplifier 141. Accordingly, the potential of the node NDe includes the influence of characteristic variations among elements (for example, the transistors TR) in the memory cell MC and the preamplifier 141. Consequently, the influence of characteristic variations among the memory cells MC and the transistors TR can be reflected in the current value of the offset current Iofst1.

For this reason, the MRAM 1 according to this embodiment can reduce the influence of PVT (Process-Voltage-Temperature) variations among the memory cells MC and the transistors TR with respect to sense results by using the offset circuit 71a.

Accordingly, the MRAM 1 according to this embodiment can automatically reduce the adverse effect of characteristic variations among the memory cells MC and the transistors TR with respect to sense result. This allows the MRAM 1 according to this embodiment to shorten the charging periods of the nodes NDe and NDf (the rise times and fall times of signal voltages).

The MRAM 1 according to this embodiment can increase the potential difference between the voltage VSMPL and the voltage VEVAL by supplying the offset current Iofst1 in the preamplifier 141. This allows the MRAM 1 according to this embodiment to improve the read margin. This allows the MRAM 1 according to this embodiment to improve the reliability of data read.

The MRM 1 according to this embodiment can improve the read operation characteristic by using the preamplifier 141 including the offset circuit 71.

(1b) Operation

An example of the operation of a memory device according to this embodiment (for example, an MRAM) will be described with reference to FIGS. 9, 10, 11, and 12. A data read operation in the memory cell MC in the MRAM according to the embodiment will be described below.

Note that in the MRAM according to this embodiment, data is written in the memory cell MC by a known data write technique. Accordingly, a description of a data write operation will be omitted.

(1b-1) Read Operation Based on Self-Reference Scheme

Figure 9:
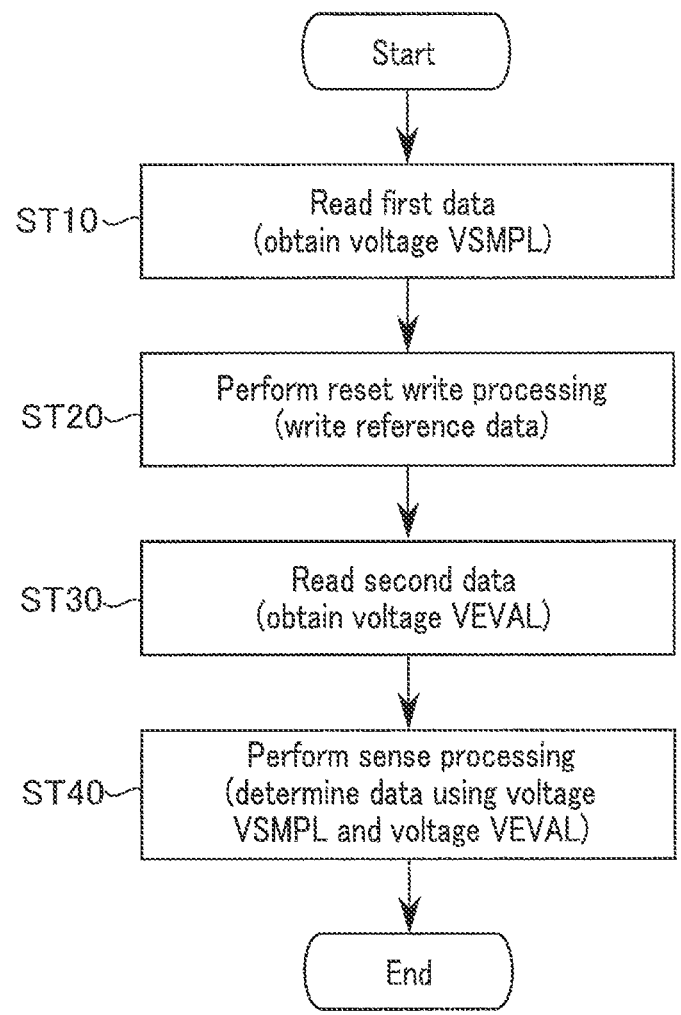
FIG. 9 is a flowchart showing an example of the operation of the memory device according to the first embodiment.

FIG. 9 is a flowchart for explaining a read operation based on the self-reference scheme in the MRAM according to this embodiment. FIG. 9 shows various types of processing executed at the time of reading data from a given memory cell MC.

<ST10>

As shown in FIG. 9, in a read operation based on the self-reference scheme, the MRAM 1 reads the first data from the memory cell (selected cell) MC-s as a data read target in step ST10 (which will also be referred to as the first cell access processing hereinafter). The control circuit 17 controls the read circuit 14 (for example, the preamplifier 141) to perform the first cell access processing.

The first cell access processing includes the processing of charging the node NDe of the preamplifier 141 to the voltage VSMPL based on the data stored in the selected cell MC-s (to be referred to as the user data hereinafter) by accessing the selected cell MC-s.

In this manner, in the first cell access processing, the control circuit 17 charges the node NDe to the voltage VSMPL based on the data stored in the selected cell MC-s in step ST10. As a result, the preamplifier 141 senses the voltage VSMPL as a signal from the selected cell MC-s in the first cell access processing.

<ST20>

In a read operation based on the self-reference scheme, in step ST20, the MRAM 1 executes a predetermined data write for the selected cell MC-s (to be referred to as reset write processing hereinafter).

The control circuit 17 controls the write circuit 13 for reset write processing.

The reset write processing includes the processing of resetting the data stored in the selected cell MC-s by writing predetermined data (to be referred to as reference data or reset data hereinafter) in the selected cell MC-s.

In this embodiment, "0" data is written in the selected cell MC-s by reset write processing. Note, however, that "1" data may be written in the selected cell MC-s by reset write processing.

<ST30>

In a read operation based on the self-reference scheme, after reset write processing, in step ST30, the MRAM 1 executes the second data read (to be also referred to as the second cell access processing hereinafter) with respect to the selected cell MC-s. The control circuit 17 controls the read circuit 14 (for example, the preamplifier 141) for the second cell access processing.

The second cell access processing includes the processing of accessing the selected cell MC-s and charging the node NDf of the preamplifier 141 to the voltage VEVAL based on data in the selected cell MC-s.

In this manner, in the second cell access processing, the control circuit 17 charges the node NDf to the voltage VEVAL based on the reference data written in the selected cell MC-s in step ST20. As a result, the preamplifier 141 senses the voltage VEVAL as a signal from the selected cell MC-s in the second cell access processing.

In this embodiment, the control circuit 17 controls the operation of the offset circuit 71a of the preamplifier 141 in the second cell access processing. The offset circuit 71a adds an offset value of a given magnitude to a sense result (for example, a mirror current based on a cell current) at the time of the second cell access processing.

<ST40>

In a read operation based on the self-reference scheme, in step ST40, the MRAM 1 executes sense processing. The control circuit 17 controls the read circuit 14 (for example, the sense amplifier 142) for sense processing.

The sense processing includes the processing of comparing the voltage VSMPL charged in the node NDe in step ST10 with the voltage VEVAL charged in the node NDf in step ST30. With this processing, the sense amplifier 142 determines whether the data (user data) stored in the selected cell MC-s is the same as the reference data.

As described above, the MRAM 1 according to this embodiment can read data from the selected cell MC-s by a read operation based on the self-reference scheme.

(1b-2) Operation Example

Figure 10:
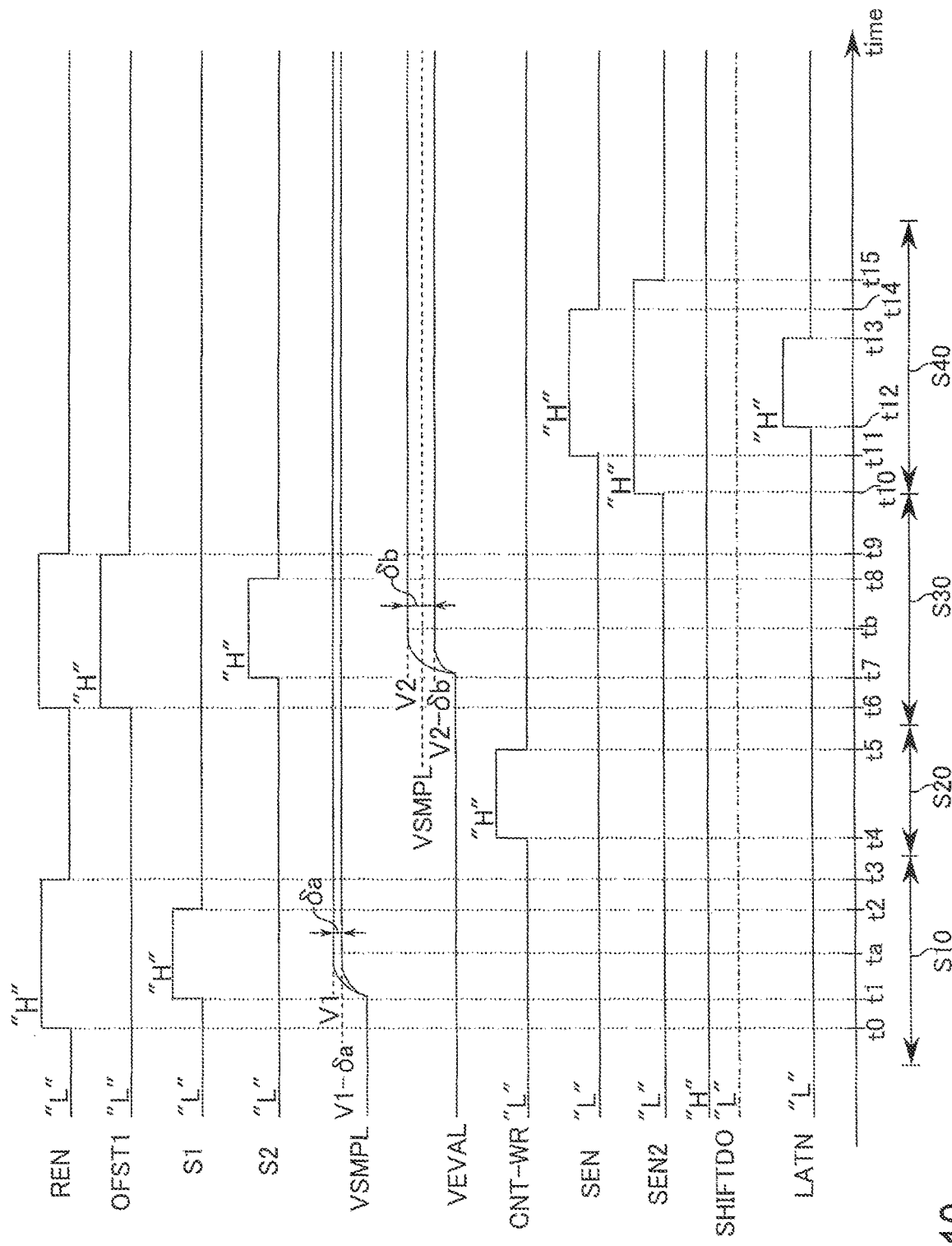
FIG. 10 is a timing chart showing an example of the operation of the memory device according to the first embodiment.

FIG. 10 is a timing chart for explaining the read operation of the MRAM according to this embodiment. FIG. 10 shows various types of signals supplied to the preamplifier 141 and the sense amplifier 142 and the voltages charged in the nodes NDe and NDf in various types of processing in the read operation based on the self-reference scheme shown in FIG. 9. Note that in the case in FIG. 10, an example in which "0" data, is written as reference data in the selected cell MC-s as a read target in reset write processing is shown.

At the time of issuing a request for an operation for the MRAM 1 according to this embodiment, the external device 9 sends the command CMD, the address ADR, and the control signal CNT to the MRAM 1 according to the embodiment. The MRAM 1 receives the command CMD, the address ADR, and the control signal CNT. The control circuit 17 executes an operation for a memory cell (selected cell) based on the address ADR in accordance with the command CMD.

When the command CMD indicates a read operation, the control circuit 17 performs various types of control for executing a read operation based on the self-reference scheme in the MRAM 1 according to this embodiment.

<Time t0 to Time t3: S10>

As shown in FIG. 10, at the time of a read operation based on the self-reference scheme, the control circuit 17 executes the first cell access processing (first data read) in a period including an interval from time t0 to time t2 based on a processing sequence for the read operation based on the self-reference scheme.

The control circuit 17 activates the preamplifier 141 of the read circuit 14. The preamplifier 141 controls the signal levels of various types of signals under the control of the control circuit 17.

At time t0, the preamplifier 141 changes the signal level of the signal REN from "L" level to "H" level. In the preamplifier 141, the transistor TR1 is set in the ON state. The preamplifier 141 applies the predetermined voltage VCLMP to the gate of the transistor TR2. The transistor TR2 controls the potential of the bit line (selected bit line) BL connected to the selected cell MC-s.

For example, the read circuit 14 (for example, the preamplifier 141) applies the ground voltage VSS to the word line (selected word line) WL connected to the selected cell MC-s. With this operation, a predetermined voltage (to be also referred to as a read voltage hereinafter) is applied to the read target selected cell MC-s.

The application of the read voltage (or the current generated by the read voltage) sets the switching element 20 in the selected cell MC-s in the ON state. This causes the selected cell MC-s to access the preamplifier 141.

Figure 11:
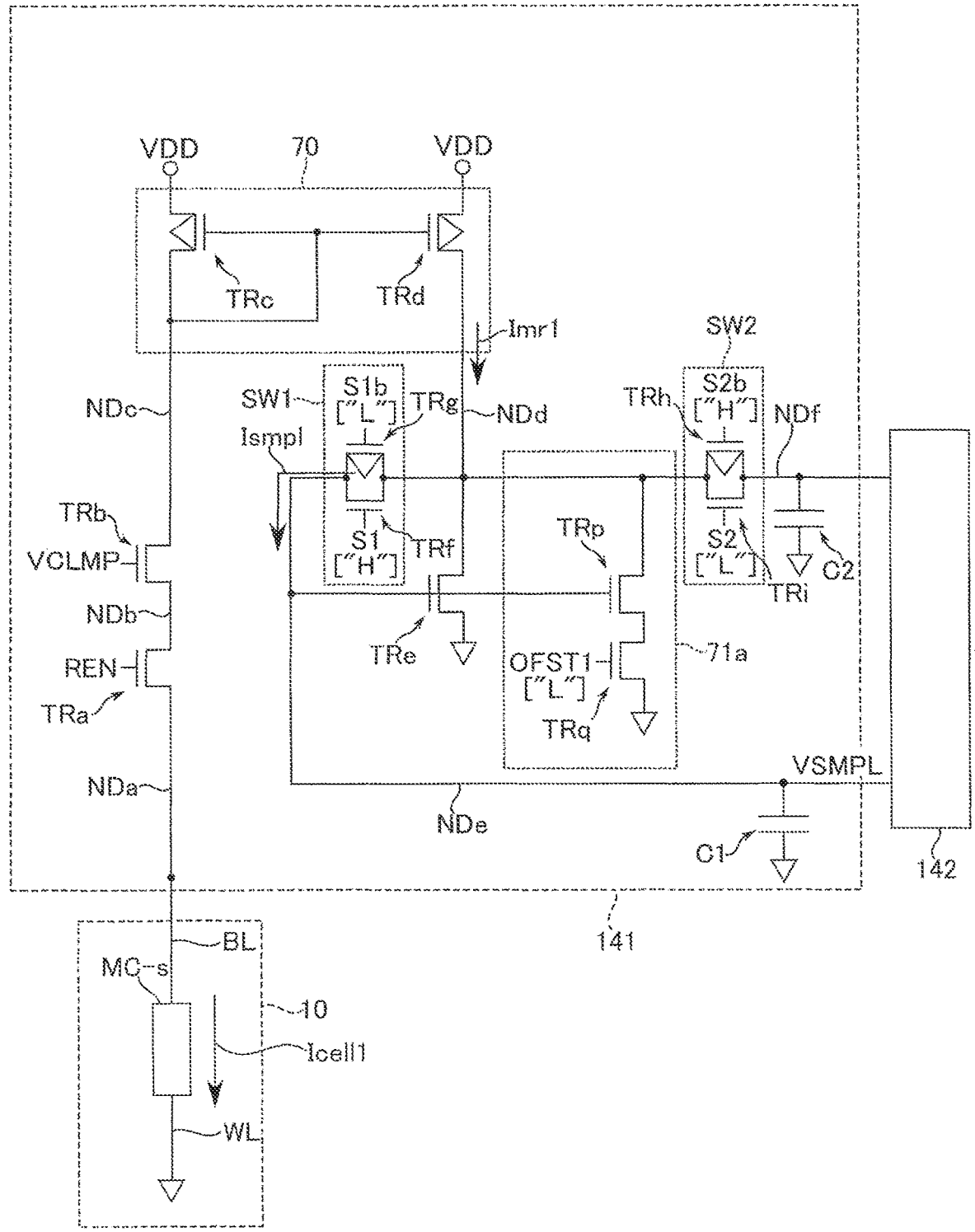

FIG. 11 schematically shows the internal state of a preamplifier in the MRAM according to this embodiment at the time of the first cell access processing in a read operation based on the self-reference scheme.

As shown in FIG. 11, the selected cell MC-s is electrically connected to the transistor TRc of the current mirror circuit 70 in the preamplifier 141 via the transistors TRa and TRb in the ON state.

After time t0, a cell current Icell1 flows in the selected cell MC-s (between the bit line BL and the word line WL). The current value of the cell current Icell1 corresponds to the user data (the resistance state of the MTJ element) in the selected cell MC-s. The potential (voltage value) of the node NDc varies in accordance with the magnitude of the cell current Icell1.

The current mirror circuit 70 including the transistors TRc and TRd causes a mirror current Imr1 based on the cell current Icell1 (the potential of the node NDc) to flow in the node NDd. When the gate size (for example, the gate width) of the transistor TRd is substantially the same as the gate size (for example, the gate width) of the transistor TRc, the current value of the mirror current Imr1 output from the transistor TRd is substantially equal to the current value of the cell current Icell1.

The preamplifier 141 sets the signal level of the signal S2 at "L" level, and sets the signal level of the signal S2b at "H" level. This sets the transistors TRh and TRi of the MOS switch SW2 in the OFF state. The node NDd is electrically disconnected from the node NDf by the MOS switch SW2 in the OFF state.

At time t1, the preamplifier 141 changes the signal level of the signal S1 from "L" level to "H" level, and changes the signal level of the signal S1b from "H" level to "L" level. This sets the transistors TRf and TRg of the MOS switch SW1 in the ON state. The node NDd is electrically connected to the node NDe via the MOS switch SW1 in the ON state.

In this embodiment, the preamplifier 141 maintains the signal level of the signal OFST1 at "L" level at the time of the first cell access processing. This sets the offset circuit 71a in the inactivated state. No current flows in the transistor TRp.

Accordingly, at the time of the first access processing, the offset circuit 71a does not apply the offset current Iofst1 to the mirror current Imr1.

The mirror current Imr1 flows as a current Ismpl1 from the node NDd to the node NDe via the MOS switch SW1 in the ON state. The capacitance component C1 of the node NDe is charged with the supplied current Ismpl1. The current value of the current Ismpl1 flowing in the node NDe is substantially equal to the current value of the mirror current Imr1 output from the current mirror circuit 70.

With this operation, the capacitance component C1 of the node NDe is charged to the voltage (to be also referred to as the charge voltage hereinafter) VSMPL having a given voltage value. For example, the voltage value of the voltage VSMPL (the potential of the node NDe) rises from the ground voltage VSS to a given voltage value.

The voltage value of the charge voltage VSMPL can have a magnitude corresponding to the current value of the current Ismpl1. The voltage value of the voltage VSMPL of the node NDe slightly differs between when the user data in the selected cell MC-s is "0" data and when the user data in the selected cell MC-s is "1" data.

For example, the voltage value of the voltage VSMPL when "0" data is stored in the selected cell MC-s is "V1". The voltage VSMPL when "1" data is stored in the selected cell MC-s has a voltage value (V1−δa) lower than the voltage value V1 by a value δa (>0).

For example, the voltage value of the voltage VSMPL of the node NDe is stabilized at time ta.

Subsequently, at time 2, the preamplifier 141 changes the signal level of the signal S1 from "H" level to "L" level, and changes the signal level of the signal S1b from "L" level to "H" level.

This sets the transistors TRg and TRf of the MOS switch SW1 in the OFF state. The node NDe is electrically disconnected from the node NDd by the MOS switch SW1 in the OFF state. As a result, the charging of the node NDe stops.

At time t3, the preamplifier 141 changes the signal level of the signal REN from "H" level to "L" level. This sets the transistor TRa in the OFF state. The preamplifier 141 is electrically disconnected from the selected cell MC-s by the transistor TRa in the OFF state.

As a result, the supply of a current (and a voltage) from the preamplifier 141 to the selected cell MC-s stops.

In this manner, the first cell access processing in the read operation based on the self-reference scheme is terminated.

<Time t4 to Time t5: S20>

In a read operation based on the self-reference scheme in the MRAM 1 according to this embodiment, the control circuit 17 executes reset write processing in an interval is from time t4 to time t5.

At time t4, the control circuit 17 changes the signal level of a control signal CNT-WR for the write circuit 13 from "L" level to "H" level. This sets the write circuit 13 in the activated state. The write circuit 13 writes reference data (for example, "0" data) in the selected cell MC-s upon supply of a write current. This sets the selected cell MC-s in the reset state (reference data holding state).

Note that in reset write processing, the node NDf of the preamplifier 141 is set in the floating state. For this reason, the potential of the node NDf can decrease to near, for example, the ground voltage VSS.

At time t5, the control circuit 17 changes the signal level of a signal CNT-WR from "H" level to "L" level. The "L"-level signal CNT-WR sets the write circuit 13 in the inactivated state. The write circuit 13 stops supplying a write current to the selected cell MC-s.

In this manner, the reset write processing in the read operation based on the self-reference scheme is terminated.

<Time t6 to Time t9: S30>

At the time of a read operation based on the self-reference scheme in the MRAM 1, the control circuit 17 executes the second cell access processing in an interval from time t6 to time t9.

The control circuit 17 activates the preamplifier 141. The preamplifier 141 controls the signal levels of various types of signals under the control of the control circuit 17.

At time t6, the preamplifier 141 changes the signal REN from "L" level to "H" level. The transistor TRa is set in the ON state. A predetermined voltage is applied to the selected cell MC-s. The switching element 20 in the selected cell MC-s is set in the ON state by the applied voltage (or current). This causes the preamplifier 141 to access the selected cell MC-s.

FIG. 12 schematically shows the internal state of a preamplifier in the MRAM according to this embodiment at the time of the second cell access processing in a read operation based on the self-reference scheme.

As shown in FIG. 12, at the time of the second access processing, a cell current Icell2 based on reference data ("0" data in this case) flows in the selected cell MC-s. The current mirror circuit 70 causes a mirror current Imr2 based on the cell current Icell2 (a reference current Iref) to flow in the node NDd.

The transistor TRe causes a current Ix to flow from the node NDd to the ground terminal VSS in accordance with the voltage VSMPL applied to the gate.

The preamplifier 141 sets the signal level of the signal S1 at "L" level, and sets the signal level of the signal S1b at "H" level. This sets the transistors TRf and TRg of the MOS switch SW1 in the OFF state. The node NDe is electrically disconnected from the node NDd by the MOS switch SW1 in the OFF state. The node NDe maintains a charged state (the held state of the voltage VSMPL).

At time t7, the preamplifier 141 changes the signal level of the signal S2 from "L" level to "H" level, and changes the signal level of the signal S2b from "H" level to "L" level. This sets the transistors TRr and TRi of the MOS switch SW2 in the ON state. The node NDd is electrically connected to the node NDf via the MOS switch SW2 in the ON state.

This causes a current Ieval1 to flow in the node NDf.

In this embodiment, at the time of the second cell access processing, the control circuit 17 causes the preamplifier 141 to offset (shift) the cell current Icell2.

The preamplifier 141 changes the signal level of the signal OFST1 from "L" level to "H" level. The "H"-level signal OFST1 activates the offset circuit 71a. The "H"-level signal OFST1 is supplied to the gate of the transistor TRq of the offset circuit 71a. This sets the transistor TRq in the ON state.

The transistor TRp of the offset circuit 71a is connected to the ground terminal VSS via the transistor TRq in the ON state. This causes the transistor TRp to output the offset current Iofst1.

As described above, the offset current Iofst1 has a current value corresponding to the current driving force of the transistor TRp (for example, the gate width of the transistor TRp) and the gate voltage. For example, the gate width of the transistor TRp is set to about 0.1 times to 0.2 times the gate width of the transistor TRd. In this case, the current value of the offset current Iofst1 is about 0.1 times to 0.2 times the current value of the mirror current Imr2 output from the transistor TRd.

The current value of the offset current Iofst1 varies in accordance with the voltage VSMPL applied to the gate of the transistor TRe.

The offset circuit 71a applies the offset current Iofst1 to the node NDd. With this operation, the offset current Iofst1 added to the mirror current Imr2 based on the cell current Icell. The offset current Iofst1 flows from the node NDd to the ground terminal VSS via the transistors TRp and TRq in the ON state. In this manner, in the offset circuit 71a, the transistors TRp and TRq in the ON state draw part of the mirror current Imr2 (offset current Iofst1) flowing in the node NDd to the ground terminal VSS.

As a result, the mirror current Imr2 at the time of the second cell access processing is offset in accordance with the current Ix corresponding to the driving force of the transistor TRe and the offset current Iofst1 corresponding to the driving force of the transistor TRp.

In this manner, in this embodiment, the transistor TRp can increase the driving force (output current) of the transistor TRe.

At the time of the second cell access processing, the transistor TRp is driven by the charge voltage VSMPL obtained at the time of the first cell access processing. The charge voltage VSMPL can include the influence of variations (for example, PVT variations) among elements in selected cells and preamplifiers. Accordingly, the influence of characteristic variations can be reflected in the current value of the offset current Iofst1.

The capacitance component C2 of the node NDf is charged with the current Ieval1 to which the offset current Iofst1 is applied. The charge voltage VEVAL of the node NDf is saturated at time tb.

At the time of the second cell access processing, the current Ix from the transistor TRe driven by the charge voltage VSMPL is applied to a current flowing in the node NDf. Applying the charge voltage VSMPL to the gate will cause the transistor TRe to flow the current Ix. The current value of the current Ix corresponds to a voltage value V1 of the charge voltage VSMPL or a voltage value V1−δa.

In addition, in the offset circuit 71a, the charge voltage VSMPL is applied to the gate of the transistor TRp. Accordingly, the current value of the offset current Iofst1 corresponds to the voltage value V1 of the charge voltage VSMPL or the volage value V1−δa.

As described above, in accordance with the user data in the selected cell MC-s at the time of the first cell access processing, the charge voltage VSMPL of the node NDe includes a slight difference δa between the voltage value of the voltage VSMPL set when the user data is "1" data and the voltage value of the voltage VSMPL set when the user data is "1" data. The difference δa causes a change in the magnitude of a current flowing in the transistors TRe and TRp at the time of the second cell access processing. Accordingly, the magnitude of the current (the current supplied to the capacitance component C2) Ieval1 flowing in the node NDf changes in accordance with the user data in the selected cell MC-s.

In this manner, the voltage value of the voltage VEVAL of the node NDf after charging changes in accordance with the sense result (VSMPL) obtained by the first cell access processing.

For example, the current value of the current Ix when the voltage value of the charge voltage VSMPL is "V1" (when the user data is "0" data) is larger than the current value of the current Ix when the voltage value of the charge voltage VSMPL is "V1−δa" (when the user data is "1" data).

In addition, the current value of the offset current Iofst1 when the voltage value of the charge voltage VSMPL is "V1" is larger than the current value of the offset current Iofst1 when the voltage value of the charge voltage VSMPL is "V1−δa".

When the data in the selected cell MC-s at the time of the second cell access processing (after reset write processing) is the same as the data in the selected cell MC-s at the time of the first cell access processing (before the reset write processing), the voltage value of the charge voltage VEVAL of the node NDf is a voltage value V2.

When the data in the selected cell MC-s at the time of the second cell access processing differs from the data in the selected cell MC-s at the time of the first cell access processing, the voltage value of the charge voltage VEVAL of the node NDf becomes a voltage value V2−δb.

The voltage value V2 is larger than the voltage value V2−δb. A potential difference δb of the charge voltage VEVAL in the second cell access processing is sufficiently large relative to the potential difference δa of the charge voltage VSMPL in the first cell access processing.

As described above, in this embodiment, at the time of the second cell access processing, the mirror current Imr2 based on the cell current Icell2 is offset by the offset current Iofst1.

With this operation, the voltage value V2 becomes larger than the voltage value V1 and the voltage value V1−δa, and a voltage value V2−δb becomes smaller than the voltage value V1 and the voltage value V1−δa.

After the voltage value of the charge voltage VEVAL of the node NDf is stabilized, at time t8, the preamplifier 141 changes the signal level of the signal S2 from "H" level to "L" level, and changes the signal level of the signal S2b from "L" level to "H" level. The transistors TRh and TRi of the MOS switch S2 are set in the OFF state. The MOS switch S2 in the OFF state electrically disconnects the node NDf from the node NDd.

As a result, the charging of the node NDf stops.

The preamplifier 141 changes the signal level of the signal OFST1 from "L" level to "H" level. The "H"-level signal OFST1 sets the transistor TRq in the OFF state. This sets the offset circuit 71a in the inactivated state.

As a result, the supply of the offset current Iofst1 to the node NDd stops.

At time t9, the preamplifier 141 changes the signal level of the signal REN from "H" level to "L" level. This sets the transistor TRa in the OFF state. The transistor TRa in the OFF state electrically disconnects the preamplifier 141 from the selected cell MC-s.

As a result, the supply of a current (and a voltage) from the preamplifier 141 to the selected cell MC-s stops.

In this manner, the second cell access processing in the read operation based on the self-reference scheme is terminated.

<Time t10 to Time t15: S40>

In a self-reference read operation of the MRAM 1 according to this embodiment, the control circuit 17 executes sense processing in an interval from time t10 to time t15.

In an interval (an interval from time t0 to time t9) before time t10, in the sense amplifier 142 in FIG. 7, the "L"-level signal SEN sets the transistors TR4, TR5, and TR6 in the ON state. The node ND2 is electrically connected to the node ND3 via the transistor TR4 in the ON state.

The transistors TR5 and TR6 in the ON state precharge the nodes ND2 and ND3 to about the power supply voltage VDD.

At time t10, the sense amplifier 142 changes the signal level of the signal SEN2 from "L" level to "H" level. The "H"-level signal SEN2 sets the transistors TR9 and TR10 in the ON state.

The nodes ND2 and ND4 are electrically connected to the node ND6 via the transistor TR9 in the ON state.

The nodes ND3 and ND5 are electrically connected to the node ND7 via the transistor TR10 in the ON state.

At time t11, the sense amplifier 142 changes the signal level of the signal SEN from "L" level to "H" level. The "H"-level signal SEN sets the transistors TR4, TR5, and TR6 in the OFF state, With this operation, the transistors TR5 and TR6 in the OFF state stop the supply of the power supply voltage VDD to the nodes ND2 and ND3. The node ND2 is electrically disconnected from the node ND3 by the transistor TR4 in the OFF state.

Note that in an interval from time t10 to time t11, the signal level of the signal LATN is set at "L" level, and the signal level of the signal LATNB is set at "H" level. This sets the transistors TR1, TR11, and TR12 in the OFF state in an interval from time t10 to time t11.

The nodes ND2 and ND4 are electrically connected to the node ND6 via the transistor TR9 in the ON state. The nodes ND3 and ND5 are electrically connected to the node ND7 via the transistor TR10 in the ON state.

The voltage VSMPL of the node NDe is applied to the gate of the transistor TR13. The transistor TR13 causes a current I1 corresponding to the voltage value of the voltage VSMPL to flow in the node ND2.

The voltage VEVAL of the node NDf is applied to the gate of the transistor TR14. The transistor TR14 causes a current I2 corresponding to the voltage value of the voltage VEVAL to flow in the node ND3.

In this embodiment, at the time of sense processing by the sense amplifier 142, the offset circuits 72a and 72b operate based on the signals SHFTDO and SHFTDOB. In order to offset the currents I1 and I2, one of the two offset circuits 72a and 72b is activated.

For example, when the preamplifier 141 has offset the cell current Icell2 (mirror current Imr2) by using the offset current Iofst1 at the time of the second cell access processing, the signal level of the signal SHFTDO is set at "H" level, and the signal level of the signal SHFTDOB is set at "L" level. This activates the offset circuit 72b on the transistor TR14 side and inactivates the offset circuit 72a on the transistor TR13 side.

In the offset circuit 72a, the "L"-level signal SHFTDOB sets the transistor TR15 in the OFF state. The transistor TR16 is electrically disconnected from the node ND6 by the transistor TR17 in the OFF state. Accordingly, the offset circuit 72a does not cause any offset current to flow.

In the offset circuit 72b, the "H"-level signal SHFTDO sets the transistor TR17 in the ON state. The transistor TR18 is electrically connected to the node ND7. The transistor TR18 causes a current Ishftb corresponding to the voltage VSHFT applied to the gate to flow. The offset current Ishftb flows from the node ND7 to the ground terminal VSS connected to the offset circuit 72b.

As a result, a current I2+Ishftb as the sum of the current I2 and the current Ishftb flows in the node ND3.

In this manner, the MRAM 1 according to this embodiment can offset one of the currents I1 and I2 in the sense amplifier 142 by using the offset circuits 72a and 72b. This allows the sense amplifier 142 to reliably make the magnitude of the voltage VSMPL (the current Ismpl1 and the current I1) differ from the magnitude of the voltage VEVAL (the current Ieval1 and the current I2).

This allows the MRAM 1 according to this embodiment to further increase the read margin based on the voltage VSMPL and the voltage VEVAL.

Note that the current value of an offset current Ishft (Ishfta, Ishftb) is set in accordance with the magnitude of the voltage VSHFT (VSEFTa, VSEFTb). The magnitude of the voltage VSHFT can be properly set based on a test process for an MRAM, the specification of the MRAM, the adjustment of the MRAM after use, and the like. Note, however, that the current value of the offset current Ishft is set to about 0.1 times to 0.2 times the current value of the currents I1 and I2.

The potential of the node ND2 changes in accordance with the magnitude of the current I1. The potential of the node NM changes in accordance with the magnitude of a current I2+Ishftb.

The magnitude relationship between the current I1 and the current I2+Ishftb changes in accordance with the voltage value of the voltage VSMPL and the voltage value of the voltage VEVAL.

When the voltage value of the voltage VSMPL is larger than the voltage value of the voltage VEVAL, the current value of the current I1 is larger than the current value of the current I2+Ishftb. In this case, the variation amount of the potential of the node ND2 (in this case, the discharge amount) is larger than the variation amount of the potential of the node ND3 (in this case, the discharge amount). Therefore, the potential of the node ND2 is lower than the potential of the node ND3.

When the voltage value of the voltage VSMPL is smaller than the voltage value of the voltage VEVAL, the current value of the current I1 is smaller than the current value of the current I2+Ishftb. In this case, the discharge amount of the node ND2 is smaller than the discharge amount of the node ND3. Therefore, the potential of the node ND2 is higher than the potential of the node ND3.

In this manner, a potential difference occurs between the node ND2 and the node ND3 based on the magnitude relationship between the voltage VSMPL and the voltage VEVAL sensed by the preamplifier preamplifier 141. The potential difference between the node ND2 and the node ND3 increases due to positive feedback by the transistors TR2, TR3, TR7, and TR8.

At time t12, the sense amplifier 142 changes the signal level of the signal LATN from "H" level to "L" level, and changes the signal level of the signal LATNB from "L" level to "H" level. The transistors TR1, TR11, and TR12 are set in the ON state. By the transistors in the ON state, the transistors TR1, TR11, and TR12 electrically connect the nodes ND2 and ND3 to the power supply terminal VDD or the ground terminal VSS.

This amplifies the potential of the node ND2 and the node ND3 to the power supply voltage VDD or the ground terminal VSS in accordance with the magnitude relationship between the nodes ND2 and ND3.

When, for example, the potential of the node ND2 is lower than the potential of the node ND3 (the voltage value of the voltage VSMPL is larger than the voltage value of the voltage VEVAL), the potential of the node ND2 drops to about the ground voltage VSS, and the potential of the node ND3 rises to about the power supply voltage VDD.

In this case, the node ND2 is set in the held state of the "L"-level signal (data), and the node ND3 is set in the held state of the "H"-level signal (data).

For example, when the potential of the node ND2 is higher than the potential of the node ND3 (the voltage value of the voltage VSMPL is smaller than the voltage value of the voltage VEVAL), the potential of the node ND2 rises to about the power supply voltage VDD, and the potential of the node ND3 drops to about the ground voltage VSS.

In this case, the node ND2 is set in the held state of the "H"-level signal, and the node ND3 is set in the held state of "L"-level signal.

As a result of sense processing, when the potential of the node ND2 is lower than the potential of the node ND3, the signal level of the signal DO is "L" level, and the signal level of the signal DOB is "H" level. Accordingly, "0" data is output as the signal DO from the output terminal OT1 of the sense amplifier 142, and "1" data is output as the signal DOE from the output terminal OT2 of the sense amplifier 142.

In contrast to this, when the potential of the node ND2 is higher than the potential of the node ND3, the signal level of the signal DO is "H" level, and the signal level of the signal DOB is "L" level. With this operation, "1" data is output as the signal DO from the output terminal OT1 of the sense amplifier 142, and "0" data, is output as the signal DOB from the output terminal OT2 of the sense amplifier 142.

In this manner, the signal based on the potentials of the nodes ND2 and ND3 is discriminated as user data (read data) in the selected cell MC-s.

At time t13, the sense amplifier 142 changes the signal level of the signal LATN from "H" level to "L" level, and changes the signal level of the signal LATNB from "L" level to "H" level. The transistors TR1, TR11, and TR12 in the OFF state electrically disconnect the nodes ND2 and ND3 from the power supply terminal VDD and the ground terminal VSS.

At time t14, the sense amplifier 142 changes the signal level of the signal SEN from "H" level to "L" level. The transistors TR2, TR3, and TR4 in the ON state electrically connect the nodes ND2 and ND3 to the power supply terminal VDD.

At time t15, the sense amplifier 142 changes the signal level of the signal SEN2 from "H" level to "L" level. The transistors TR9 and TR10 in the OFF state electrically disconnect the node ND2 from the node ND6, and electrically disconnect the node ND3 from the node ND7.

This inactivates the sense amplifier 142. The nodes ND2 and ND3 are set in the precharge state.

In this manner, the sense processing in the read operation based on the self-reference scheme is terminated.

The data DO and DOB obtained by the read operation are transferred from the read circuit 14 to the external device 9 via the input/output circuit 16.

In this embodiment, the read data (the signal DO) may be written in the selected cell MC-s by writeback processing at a given timing (for example, before an operation corresponding to the next command). This changes the selected cell MC-s from the reset state to the held state of the user data.

In the above manner, the read operation based on the self-reference scheme in the MRAM 1 according to this embodiment is terminated.

(1c) Characteristics

The characteristics of the read circuit (the preamplifier and the sense amplifier) of the MRAM according to this embodiment will be described with reference to FIGS. 13, 14, and 15.

Figure 13:
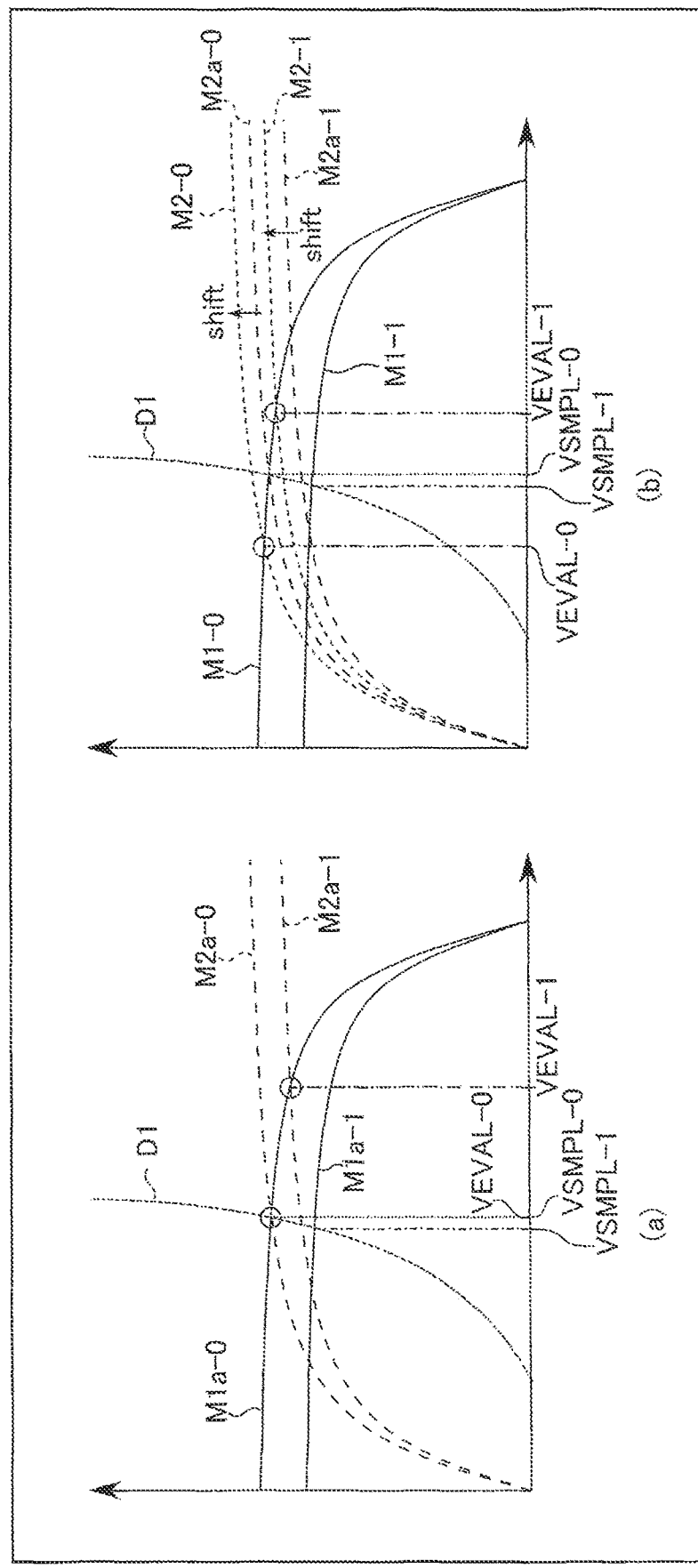

(a) and (b) of FIG. 13 are graphs showing the operating point characteristics of a preamplifier in the MRAM according to this embodiment.

(a) of FIG. 13 is a graph showing the operation characteristics of a preamplifier according to a comparative example. (b) of FIG. 13 is a graph showing the operating point analysis of a preamplifier in the MRAM according to this embodiment.

Referring to each of (a) and (b) of FIG. 13, the abscissa of the graph corresponds to voltage, and the ordinate of the graph corresponds to current.

Each of (a) and (b) of FIG. 13 indicates the voltage-current characteristic of the transistor TRd of the current mirror circuit in the preamplifier concerning the data held state of a memory cell (selected cell).

Each of (a) and (b) of FIG. 13 indicates a plurality of lines M1-0, M1-1, M2-0, M2-1, M2a-0, and M2a-1 corresponding to the voltage-current characteristics.

The line M1-0 indicates the voltage-current characteristic of the transistor TRd when the selected cell holds "0" data (the MTLT element is in the P state) at the time of the first cell access processing. The line M1-1 indicates the voltage-current characteristic of the transistor TRd when the selected cell holds "0" data (the MTJ element is in the P state) at the time of the first cell access processing.

The lines M2-0 and M2a-0 indicate the voltage-current characteristics of the transistor TRd (for example, a constituent element including the transistors TRd, TRe and TRp) at the time of the second cell access processing when the selected cell holds "0" data as user data at the time of the first cell access processing. The lines M2-1 and M2a-1 indicate the voltage-current characteristics of the transistor TRd (for example, a constituent element including the transistors TRd, TRe, and TRp) at the time of the second cell access processing when the selected cell holds "1" data as user data at the time of the first cell access processing.

The line D1 indicates the voltage-current characteristic of the transistor (diode-connected transistor) TRe of the preamplifier.

(a) of FIG. 13 shows the characteristics of the preamplifier according to the comparative example. The preamplifier according to the comparative example includes no offset circuit.

(b) of FIG. 13 shows the characteristics of the preamplifier in the MRAM according to this embodiment. As described above, in this embodiment, the preamplifier 141 includes the offset circuit 71a. The offset circuit 71a applies an offset current to a current corresponding to a cell current at the time of the second cell access processing in a read operation based on the self-reference scheme.

As shown in (a) of FIG. 13, based on the voltage-current characteristics of each element, a voltage VEVAL-0x obtained by the second cell access processing when the user data is "0" data is substantially the same as voltages VSMPL-0 and VSMPL-1 obtained by the first cell access processing.

A voltage VEVAL-1x obtained by the second cell access processing when the user data is "1" data is higher than the voltages VSMPL-0 and VSMPL-1 obtained by the first cell access processing.

As shown in (b) of FIG. 13, in this embodiment, with an offset operation for the second cell access processing by the offset circuit, the line M2-0 shifts to the larger current value side relative to the line M2x-0. Likewise, the line M2-1 shifts to the larger current value side relative to the line M2x-1.

This makes a voltage VEVAL-0 lower than the voltage VSMPL. A voltage VEVAL-1 is higher than the voltage VSMPL.

In this manner, in this embodiment, a relatively large margin is ensured between the voltage VEVAL-0 and the voltage VSMPL.

Figure 14:
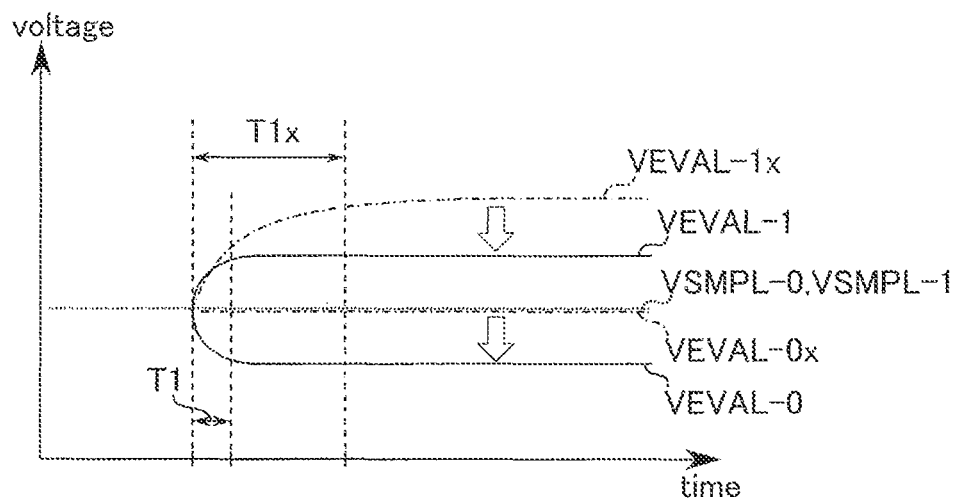

FIG. 14 is a schematic view for explaining the relationship between the voltage obtained by the first cell access processing and the voltage obtained by the second cell access processing in the MRAM according to this embodiment.

Referring to FIG. 14, the abscissa of the graph corresponds to time, and the ordinate of the graph corresponds to voltage value. Referring to FIG. 14, the voltage VSMPL is expressed by one line because of the slight difference between the voltage value set when the user data is "0" data and the voltage value set when the user data is "1" data.

As shown in FIG. 14, the voltage value of the voltage VEVAL-0 shifts to the lower potential side relative to a voltage VEVAL-0x in the comparative example by an offset operation by the offset circuit 71a in the preamplifier 141.

Accordingly, the difference between the voltage VSMPL sensed at the time of the first cell access processing and the voltage VEVAL-0 sensed at the time of the second cell access processing in this embodiment is larger than the difference between the voltage VSMPL and the voltage VEVAL-0x in the comparative example.

In this manner, in the MRAM according to this embodiment, a larger read margin can be ensured for a voltage value corresponding to the sense result obtained by the second cell access processing for a voltage value corresponding to the sense result obtained by the first cell access processing.

As a result, the MRAM according to this embodiment can improve the data read reliability.

As shown in FIG. 14, for the reason described later, in the MRAM according to this embodiment, the preamplifier 141 including the offset circuit 71a can shorten a period T1 taken for the voltage VEVAL to reach a predetermined voltage value (for example, 80% of the maximum voltage value or 80% of the minimum voltage value) as compared with a period T1x taken for the voltage VEVAL in the preamplifier according to the comparative example to reach a predetermined voltage value.

Figure 15:
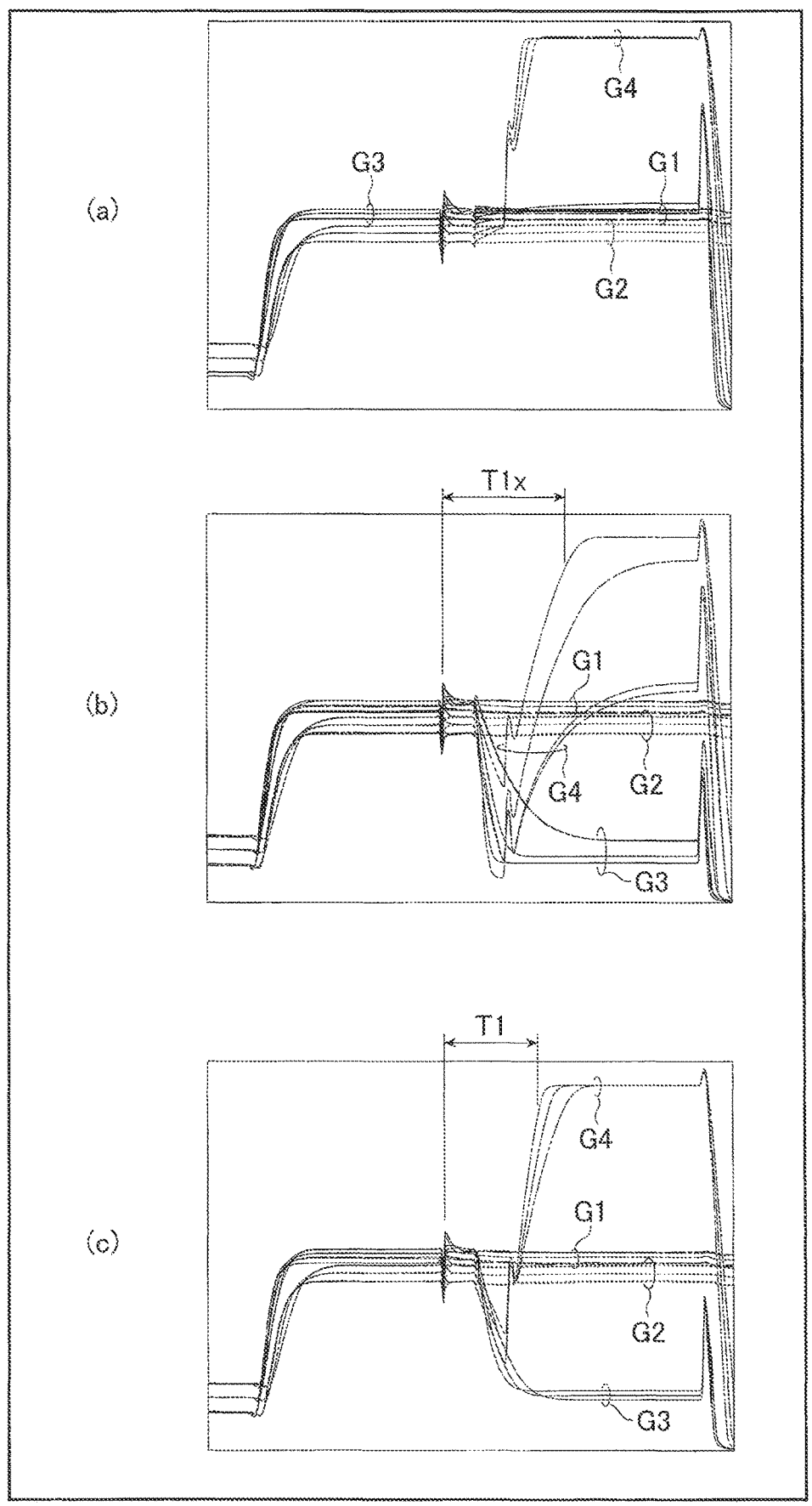

FIG. 15 is a graph showing a temporal change in voltage in the preamplifier in the MRAM according to this embodiment.

(a) of FIG. 15 is a graph showing a temporal change in the internal voltage of a preamplifier according to the first comparative example. The preamplifier according to the first comparative example has a circuit configuration including no offset circuit. (b) of FIG. 15 is a graph showing a temporal change in the internal voltage of a preamplifier according to the second comparative example. The preamplifier according to the second comparative example has a circuit configuration including an offset circuit that outputs an offset current with a voltage having a fixed value. (c) of FIG. 15 is a graph showing a temporal change in the internal voltage of the preamplifier in the MRAM according to this embodiment.

Referring to each of (a), (b), and (c) of FIG. 15, the abscissa of the graph corresponds to time, and the ordinate of the graph corresponds to voltage.

Referring to each of (a), (b), and (c) of FIG. 15, a plurality of lines belonging to a group G1 correspond to the charge voltage VSMPL-0 of the node NDe when the user data is "0" data. A plurality of lines belonging, to a group G2 correspond to the charge voltage VSMPL-1 of the node NDe when the user data is "1" data. A plurality of lines belonging to a group G3 correspond to the charge voltage VEVAL-0 of the node NDf when the user data is "0" data. A plurality of lines belonging to a group G4 correspond to the charge voltage VEVAL-1 of the node NDf when the user data is "1" data.

Referring to each of (a), (b), and (c) of FIG. 15, the magnitudes of the threshold voltages of the transistors TRd and TRe connected to the node NDd in the preamplifier 141 are set as parameters in experiments.

Referring to (a) of FIG. 15, the voltage difference between the voltage VEVAL-0 and the voltages VSMPL-0 and VSMPL-1 is relatively small. Accordingly, as in the first comparative example, when the preamplifier includes no offset circuit, the read margin in the read circuit is small.

As shown in (b) of FIG. 15, when an offset current is generated with a voltage having a fixed value, voltage values greatly vary under corner conditions for the respective voltages VSMPL and VEVAL (the leading edges and trailing edges of voltage pulses) in accordance with variations in memory cell characteristics and variations in the threshold voltages of the transistors TRd and TRe.

In the preamplifier in the case shown in (b) of FIG. 15, a period (to be referred to as an SDT (Signal Development Time) hereinafter) T1x in which each signal voltage reaches a given voltage value from the leading edge (trailing edge) of the voltage is relatively long due to the influence of characteristic variations among elements.

As shown in (c) of FIG. 15, in the MRAM according to this embodiment, the preamplifier 141 including the offset circuit 71a allows relatively large voltage differences between the voltage VEVAL-0 and the voltage VSMPL and between the voltage VEVAL-1 and the voltage VSMPL. Accordingly, the MRAM according to this embodiment can obtain a large read margin.

In this embodiment, in the offset circuit 71a in the preamplifier 141, a voltage corresponding to the cell current Icell is applied to the gate of the transistor TRp that outputs an offset current.

As a result, in this embodiment, a monitoring result on cell currents from memory cells that can include characteristic variations is reflected in the magnitude of an offset current. The preamplifier 141 can apply a more suitable offset value (offset current) to a sense result (cell current).

Accordingly, the MRAM 1 according to this embodiment can reduce the adverse effect of PVT (Process-Voltage-Time) variations with respect to sense results (the voltages VSMPL and VEVAL) by using the offset circuit 71a of the preamplifier 141.

The MRAM 1 according to this embodiment can shorten the SLAT (for example, the period T1) of the voltage sensed by the preamplifier with a reduction in the influence of PVT variations. This allows the MRAM 1 according to this embodiment to shorten the read operation period.

As a result, the MRAM according to this embodiment can speed up the read operation.

FIG. 16 is graph, for explaining the characteristics of the read circuit in the MRAM according to this embodiment.

FIG. 16 is graphs for evaluating the characteristics of of the preamplifier and the sense amplifier in the read circuit in the MRAM according to this embodiment.

(a) of FIG. 16 shows the characteristics of the read circuit when only the sense amplifier according to this embodiment applies an offset to the sense result obtained by the preamplifier. (b) of FIG. 16 shows the characteristics of the read circuit in the MRAM according to this embodiment when only the preamplifier applies an offset to the sense result obtained by the preamplifier. (c) of FIG. 16 shows the characteristics of the read circuit in the MRAM according to this embodiment when both the preamplifier and the sense amplifier apply an offset to the sense result obtained by the preamplifier.

Referring to each of (a), (b), and (c) of FIG. 16, the abscissa of the graph corresponds to the offset voltage (VSHFT) used in the offset circuit of the sense amplifier, and the ordinate of the graph corresponds to the standard deviation ($\sigma$). Each of (a), (b), and (c) of FIG. 16 shows a sigma plot of the offset voltage of the sense amplifier.

Referring to each of (a), (b), and (c) of FIG. 16, a region where the offset voltage is positive corresponds to a case in which the signal level of the signal SHFTDO is set at "H" level and the signal level of the signal SHFTDOB is at "L" level. Referring to each of (a), (b), and (c) of FIG. 16, a region where the offset voltage is negative corresponds to a case in which the signal level of the signal SHFTDO is set at "L" level and the signal level of the signal SHFTDOB is set at "H" level.

Referring to (a), (b), and (c) of FIG. 15, when the read circuit (the preamplifier and the sense amplifier) has ideal characteristics, a sigma plot representing the relationship between the offset voltage VSHFT of the sense amplifier 142 and the deviation $\sigma$ is expressed by a straight line.

As shown in (a) of FIG. 16, when only the sense amplifier 142 applies an offset value to a sense result, the plot is not expressed by a straight line in a voltage range (for example, a region RX in each of (a), (b), and (c) of FIG. 16) equal to or lower than the threshold voltage of the N-type transistor of the offset circuit 72 of the sense amplifier 142.

As shown in (b) of FIG. 16, in this embodiment, when only the preamplifier 141 applies an offset value to a sense result, the sigma plot is expressed by a straight line.

As shown in (c) of FIG. 16, in this embodiment, when both the preamplifier 141 and the sense amplifier 142 apply an offset value to a sense result, a straight sigma plot is obtained in a voltage region higher than the threshold voltage of an N-type transistor.

In this manner, the MRAM according to this embodiment can improve the read margin by using the offset circuit of the preamplifier and the offset circuit of the sense amplifier.

As shown in FIGS. 13, 14, 15, and 16, the MRAM according to this embodiment can improve the read operation characteristics and reliability.

Therefore, the characteristics of the memory device according to this embodiment can be improved.

(2) Second Embodiment

A memory device according to the second embodiment will be described with reference to FIGS. 17, 18, 19, and 20.

In the memory device (for example, an MRAM) according to this embodiment, the configuration of the preamplifier of a read circuit is different from the configuration of the preamplifier described in the first embodiment.

(2a) Configuration Example

FIG. 17 is an equivalent circuit diagram showing an example of the configuration of the preamplifier of a read circuit in the MRAM according to this embodiment.

As shown in FIG. 17, in this embodiment, the connection position of an offset circuit 71b in a preamplifier 141 is different from that of the offset circuit in the preamplifier according to the first embodiment.

In this embodiment, the preamplifier 141 can control the driving force of a current mirror circuit 70 by using the offset circuit 71b.

The offset circuit 71b is connected to a node NDc, a node NDd, and a power supply terminal VDD in the preamplifier 141.

The offset circuit 71b includes transistors TRr and TRs. Each of the transistors TRr and TRs is a p-type electric-field transistor. Each of the transistors TRr and TRs has two terminals and a gate.

One terminal of the transistor TRr is connected to the node NDd. The other terminal of the transistor TRr is connected to one terminal of the transistor TRs. The other terminal of the transistor TRs is connected to the power supply terminal VDD.

The gate of the transistor TRr is connected to the node NDc commonly with the gates of transistors TRc and TRd.

A signal OFST2 is supplied to the gate of the transistor TRs. The transistor TRs is on/off-controlled in accordance with the signal level of the signal OFST2.

When the offset circuit 71b is set in the inactivated state, the signal level of the signal OFST2 is set at "H" level. The "H"-level signal OFST2 sets the transistor TRs in the OFF state. In this case, the offset circuit 71b does not cause an offset current Iofst2 to flow.

When the offset circuit 71b is set in the activated state, the signal level of the signal OFST2 is set at "L" level. The "L"-level signal OFST2 sets the transistor TRs in the ON state. In this case, the transistor TRr is electrically connected to the power supply terminal VDD via the transistor TRs in the ON state. This makes the offset circuit 71b to cause the offset current Iofst2 to flow.

In the offset circuit 71b in the activated state, the offset current Iofst2 flows from the power supply terminal VDD to the node NDd via the current paths (channels) of the transistors TRr and TRs.

The offset circuit 71b supplies the offset current Iofst2 from the power supply terminal VDD to the node NDd. With this operation, the offset circuit 71b increases the current value of the current flowing in the node NDd by the current value of the offset current Iofst2.

The offset circuit 71b offsets the magnitude of a mirror current Imr based on a cell current Icell of a selected cell MC-s. The offset circuit 71b applies the offset current Iofst2 having a given current value to the mirror current Imr.

The magnitude of the offset current Iofst2 corresponds to the current driving force of the transistor TRr.

The current driving force of the transistor TRr can be set in accordance with the gate size of the transistor TRr (for example, the gate width of the transistor TRr).

The gate width of the transistor TRr is smaller than the gate width of the transistor TRe. The current value of the offset current Iofst2 is smaller than the current value of the mirror current Imr output from the transistor TRd.

For example, the gate width of the transistor TRr is set to about 0.1 times to 0.2 times the gate width of the transistor TRd. In this case, the current value of the offset current Iofst2 is about 0.1 times to 0.2 times the current value of the mirror current Imr.

The magnitude of the offset current Iofst2 changes in accordance with the potential of the node NDc (for example, the cell current Icell in the first cell access processing).

In this embodiment, the offset circuit 71b applies the offset current Iofst2 to the mirror current Imr flowing from the node NDd to a node NDe at the time of the first cell access processing in a read operation based on the self-reference scheme.

In this manner, in this embodiment, the offset circuit 71b can increase the driving force of the transistor TRd of a current mirror circuit 40.

(2b) Example of Operation

An example of the operation of the MRAM according to this embodiment will be described with reference to FIGS. 18, 19, and 20.

Figure 18:
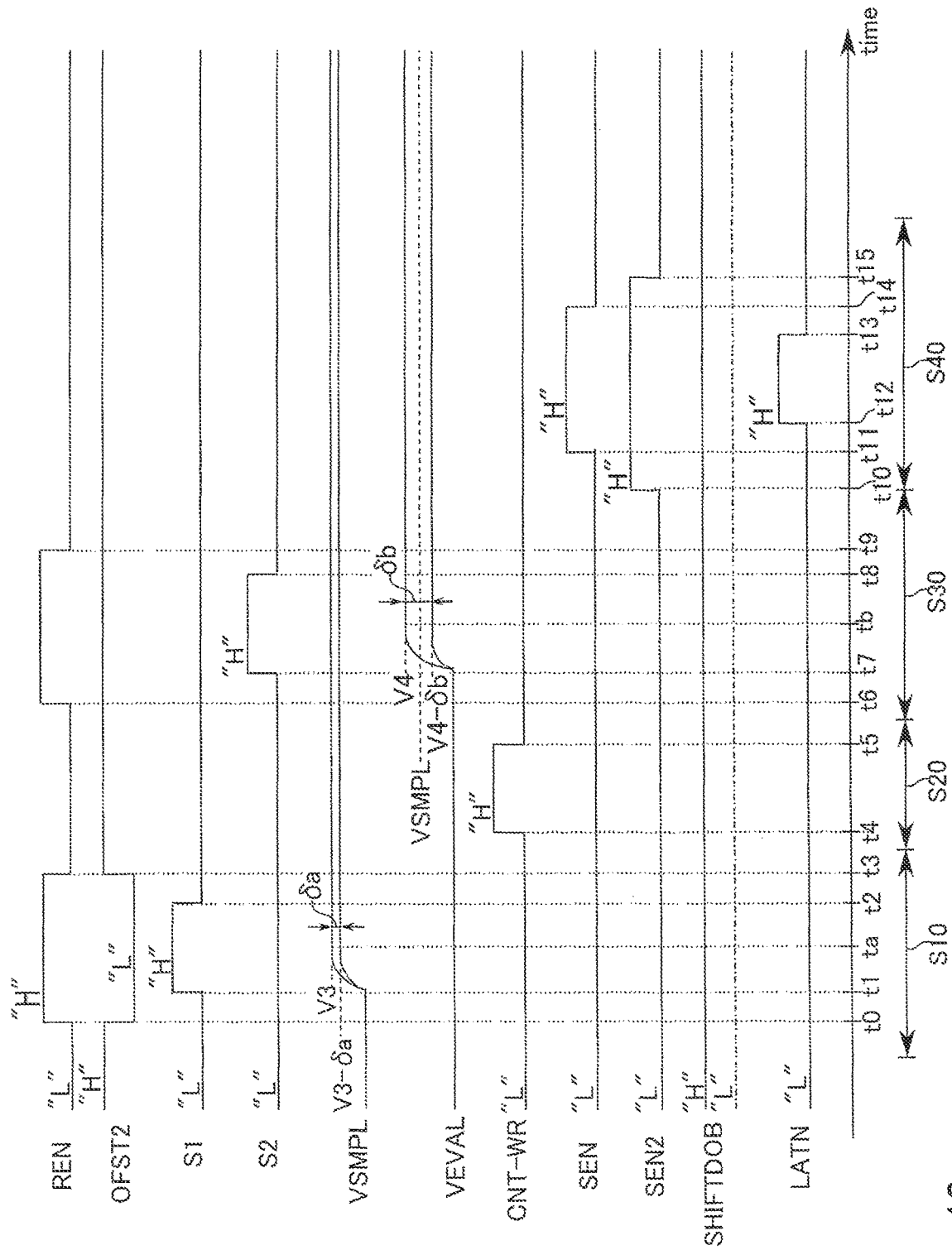
FIG. 18 is a timing chart showing an example of the operation of the memory device according to the second embodiment.

FIG. 18 is a timing chart for explaining an example of the operation of the MRAM according to this embodiment.

An MRAM 1 according to this embodiment executes a read operation based on the self-reference scheme in FIG. 9 in the same manner as in the first embodiment.

<Time t0 to Time t3: S10>

As shown in FIG. 18, in the MRAM 1 according to this embodiment, a control circuit 17 executes the first cell access processing in an interval from time t0 to time t3 in the read operation based on the self-reference scheme.

The control circuit 17 activates the preamplifier 141 of a read circuit 14. The preamplifier 141 controls the signal levels of various types of signals under the control of the control circuit 17.

At time t0, the preamplifier 141 changes the signal level of the signal REN from "L" level to "H" level. The preamplifier 141 applies a predetermined voltage VCLMP to the gate of a transistor TRb.

This causes a cell current Icell1 to flow in the selected cell MC-s. The cell current Icell1 has a current value corresponding to user data in the selected cell MC-s.

Figure 19:
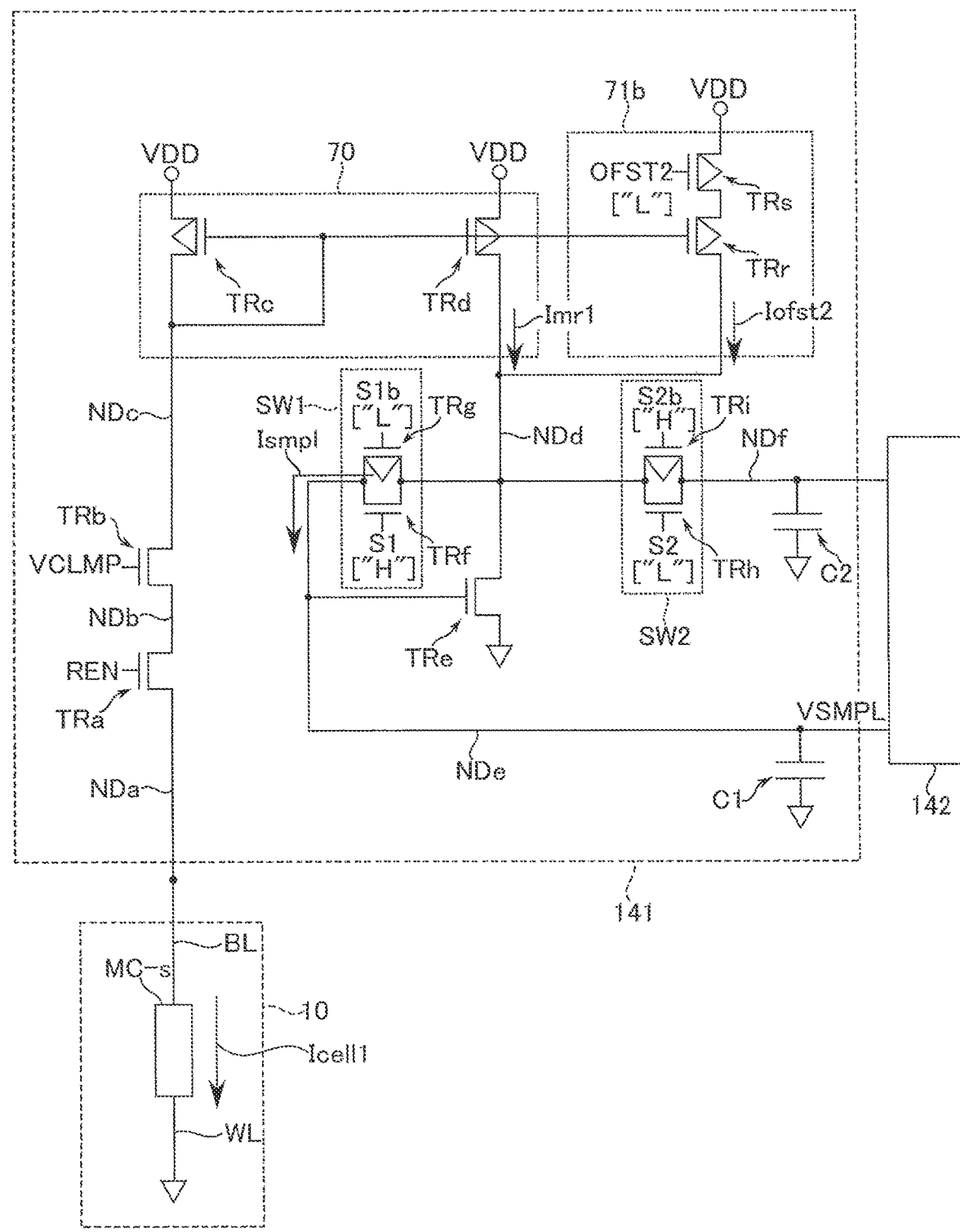
FIGS. 19 and 20 are diagrams showing an example of the operation of the memory device according to the second embodiment.

FIG. 19 schematically shows the internal state of a preamplifier at the time of the first cell access processing in a read operation based on the self-reference scheme in the MRAM according to this embodiment.

In the preamplifier 141, the current mirror circuit 70 causes a mirror current Imr1 based on the cell current Icell1 to flow in the node NDd.

At time t1, the preamplifier 141 sets the signal level of a signal S1 at "H" level, and sets the signal level of a signal S1b at "L" level. This sets transistors TRg and TRh of a MOS switch SW1 in the ON state. The MOS switch SW1 in the ON state electrically connects the node NDe to the node NDd.

Note that a MOS switch SW2 in the OFF state electrically disconnects a node NDf from the node NDd.

In this embodiment, the offset circuit 71b is activated at the time of the first cell access processing.

The preamplifier 141 changes the signal level of the signal OFST2 from "H" level to "L" level at the time of the first cell access processing. The "L"-level signal OFST2 sets the offset circuit 71b in the activated state. With this operation, the offset circuit 71b causes the offset current Iofst2 to flow at the time of the first cell access processing.

When the offset circuit 71b is set in the activated state, the potential of the node NDc is applied to the gate of the transistor TRr. At the time of the first cell access processing, the offset circuit 71b causes the offset current Iofst2 to flow.

The offset current Iofst2 flows from the power supply terminal VDD to the node NDd via the current paths of the transistors TRr and TRs.

The current value of the offset current Iofst2 corresponds to the current value of the current output from the transistor TRr. Accordingly, the current value of the offset current Iofst2 changes in a range corresponding to the current driving force of the transistor TRr in accordance with the potential of the node NDc (the magnitude of the cell current Icell1).

In this manner, in this embodiment, the transistor TRr can increase the driving force (output current) of the transistor TRd.

A current including the mirror current Imr1 and the offset current Iofst2 flows as a current Ismpl2 from the node NDd to the node NDe via the MOS switch SW1 in the ON state. The node NDe is charged with a current Ismpl2. In this embodiment, the current value of the current Ismpl2 flowing in the node NDe is substantially equal to the sum of the current value of the mirror current Imr1 and the current value of the offset current Iofst2.

Charging the node NDe with the current Ismpl2 (mirror current Imr2+Iofst2) will raise a charge voltage VSMPL of the node NDe from a ground voltage VSS to a given voltage value.

As described above, when the selected cell MC-s holds "0" data, the charge voltage VSMPL has a voltage value V3. When the selected cell MC-s holds "1" data, the charge voltage VSMPL has a voltage value V3–δc lower than the voltage value V3.

For example, at time ta, the potential of the node NDe is saturated.

At time t2, the preamplifier 141 changes the signal level of the signal S1 from "H" level to "L" level, and changes the signal level of the signal S1b from "L" level to "H" level. This sets the MOS switch SW1 in the OFF state. The MOS switch SW1 in the OFF state electrically disconnects the node NDe from the node NDd.

At time t3, the preamplifier 141 changes the signal level of a signal REN from "H" level to "L" level. This electrically disconnects the preamplifier 141 from the selected cell MC-s.

In this manner, the first cell access processing in the read operation based on the self-reference scheme is terminated.

<Time t4 to Time t5: S20>

The control circuit 17 executes reset write processing as in the first embodiment in an interval from time t3 to time t4 in a read operation based on the self-reference scheme in the MRAM 1 according to this embodiment.

After the first cell access processing, at time t4, a write circuit 13 is activated by a "H"-level control signal CNT-WR. The write circuit 13 writes reference data ("0" data in this case) in a selected cell MC. This sets the selected cell MC-s in the reset state (the held state of reference data).

At time t5, the write circuit 13 is inactivated by the "L"-level control signal CNT-WR.

In this manner, the reset write processing in the read operation based on the self-reference scheme is terminated.

<Time t6 to Time t9: S30>

In an interval from time t6 to time t9, the control circuit 17 executes the second cell access processing.

The control circuit 17 activates the preamplifier 141. The preamplifier 141 controls the signal levels of various types of signals under the control of the control circuit 17.

At time t6, the preamplifier 141 changes the signal REN from "L" level to "H" level. With this operation, as in the first embodiment, the preamplifier 141 accesses the selected cell MC-s via the transistor TRa in the ON state.

Figure 20:
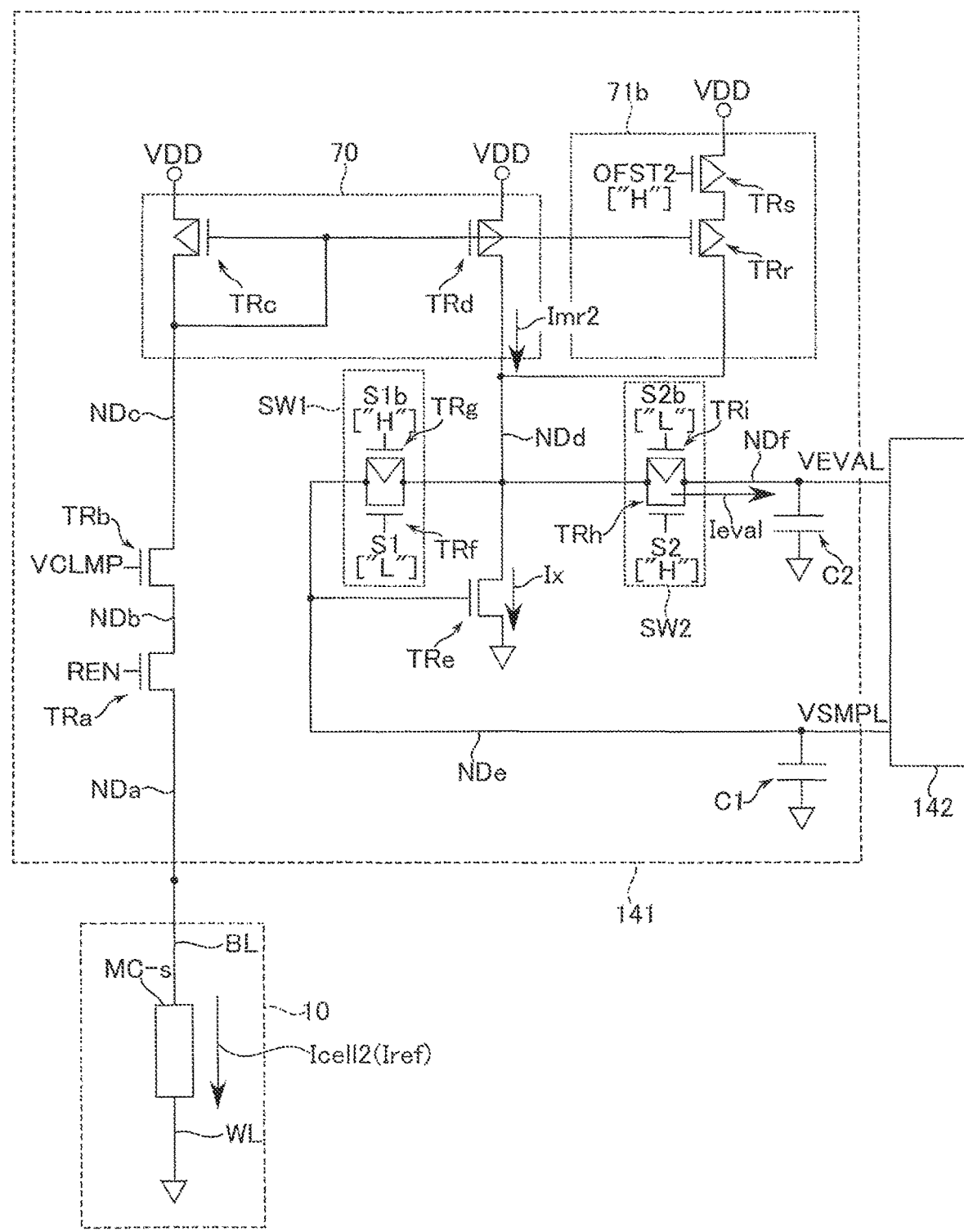

FIG. 20 is a schematic view showing the internal state of a preamplifier in the MRAM according to this embodiment at the time of the second cell access processing in a read operation.

As shown in FIG. 20, a cell current Icell2 corresponding to reference data ("0" data in this case) flows in the selected cell MC-s.

The current mirror circuit 70 causes a mirror current Imr2 based on the cell current Icell2 to flow in the node NDd.

At time t7, the preamplifier 141 sets the signal level of the signal S1 at "L" level, and sets the signal level of the signal S1b at "H" level. This sets the MOS switch SW1 in the OFF state. The MOS switch SW1 in the OFF state electrically disconnects the node NDe from the node NDd. The node NDe maintains the charged state (the held state of the voltage VSMPL).

The preamplifier 141 changes the signal level of the switch S2 from "L" level to "H" level, and changes the signal level of the signal S2b from "H" level to "L" level. This sets the MOS switch SW2 in the ON state. This electrically connects the node NDd to the node NDf via the MOS switch SW2 in the ON state.

At the time of the second cell access processing, the voltage VSMPL of the node NDe sets the transistor TRe in the ON state.

Accordingly, a transistor TRe causes a current Ix having a current value corresponding to the voltage value (V3 or V3–δc) of the charge voltage VSMPL to flow from the node NDd to the ground terminal VSS.

In this embodiment, the preamplifier 141 inactivates the offset circuit 71b at the time of the second cell access processing. The preamplifier 141 sets the signal level of a signal OFST2 at "H" level. This sets the offset circuit 71b in the inactivated state. As a result, no offset current is supplied to the node NDd.

The mirror current Imr2 flows in the node NDd. In addition, the current Ix flows from the node NDd to the ground terminal VSS.

Accordingly, in this embodiment, a current Ieval2 flowing in the node NDf corresponds to "Imr2–Ix".

The supply of the current Ieval2 charges a capacitance component C2 of the node NDf. The charge voltage of the node NDf is saturated at time tb.

For example, when user data in the selected cell MC-s is "0" data, the voltage value of a charge voltage VEVAL is "V4". When the user data in the selected cell MC-s is "1" data, the voltage value of the charge voltage VEVAL becomes a value (V4–δd) smaller than the voltage value V4 by a given value δd.

In this manner, in this embodiment, as in the first embodiment, the difference δd, which is sufficiently larger than the difference δc, is ensured between the voltage value of the charge voltage VEVAL when the selected cell MC-s holds "0" data and the voltage value of the charge voltage VEVAL when the selected cell MC-s holds the "1" data.

In addition, in this embodiment, as in the first embodiment, a relatively large margin (potential difference) is ensured between the voltage VEVAL when the user data is "0" data and the voltage VSMPL.

After the voltage VEVAL of the node NDf is stabilized, at time t8, the preamplifier 141 changes the signal level of a signal S2 from "H" level to "L" level, and changes the signal level of a signal S2b from "L" level to "H" level. The MOS switch SW2 in the OFF state electrically disconnects the node NDf from the node NDd. This stops charging the node NDf.

The preamplifier 141 changes the signal level of the signal REN from "H" level to "L" level. The "L"-level signal REN sets a transistor TRa in the OFF state. The transistor TRa in the OFF state stops supplying a current from the preamplifier 141 to the selected cell MC-s.

In this manner, the second cell access processing in the read operation based on the self-reference scheme is terminated.

<Time t10 to Time t15: S40>

After the second cell access processing in a read operation based on the self-reference scheme, the control circuit 17 executes sense processing in the same manner as in the first embodiment.

As in the first embodiment, the sense amplifier 142 controls the signal levels of signals SEN2, SEN, and LATN.

A node ND2 is electrically connected to a node ND6, and the node ND3 is electrically connected to the node ND7.

A transistor TR13 causes a current I1 to flow in the node ND6. A transistor TR14 causes a current I2 to flow in the node ND7.

In this embodiment, the sense result (voltage VSMPL) obtained by the first cell access processing is offset.

Accordingly, an offset circuit 72a is activated, and an offset circuit 72b is inactivated. An "H"-level signal SHFT-DOB sets a transistor TR15 in the offset circuit 72a in the ON state. A transistor TR16 causes a current Ishfta to flow from the node ND6 to the ground terminal VSS. The current value of the current Ishfta corresponds to a voltage VSHFTa.

With this operation, the offset current Ishfta is applied to the current I1 flowing in the node ND6 in accordance with the voltage VSMPL. A current I1+Ishfta flows in the node ND2.

The potential of the node ND2 and the potential of the node ND3 vary in accordance with the current I1+Ishfta and the current I2. The potentials of the nodes ND2 and ND3 are amplified by the supply of the voltages VDD and VSS from the transistors TR1, TR11, and TR12 and the positive feedback of the transistors TR2, TR3, TR7, and TR8.

This determines the potential of the node ND2 and the potential of the node ND3 (the signal levels of signals DO and DOb).

In this manner, the sense processing in the read operation based on the self-reference scheme is terminated.

The data DO and DOB obtained by the read operation are transferred from the read circuit 14 to an external device 9 via an input/output circuit 16.

In the above manner, the read operation based on the self-reference scheme in the MRAM 1 according to this embodiment is terminated.

The MRAM 1 according to this embodiment can obtain substantially the same effects as those described with reference to FIGS. 13, 14, 15, and 16.

Therefore, the memory device according to the second embodiment can improve the characteristics of the memory device.

(3) Third Embodiment

A memory device according to the third embodiment will be described with reference to FIGS. 21 and 22.

Figure 21:
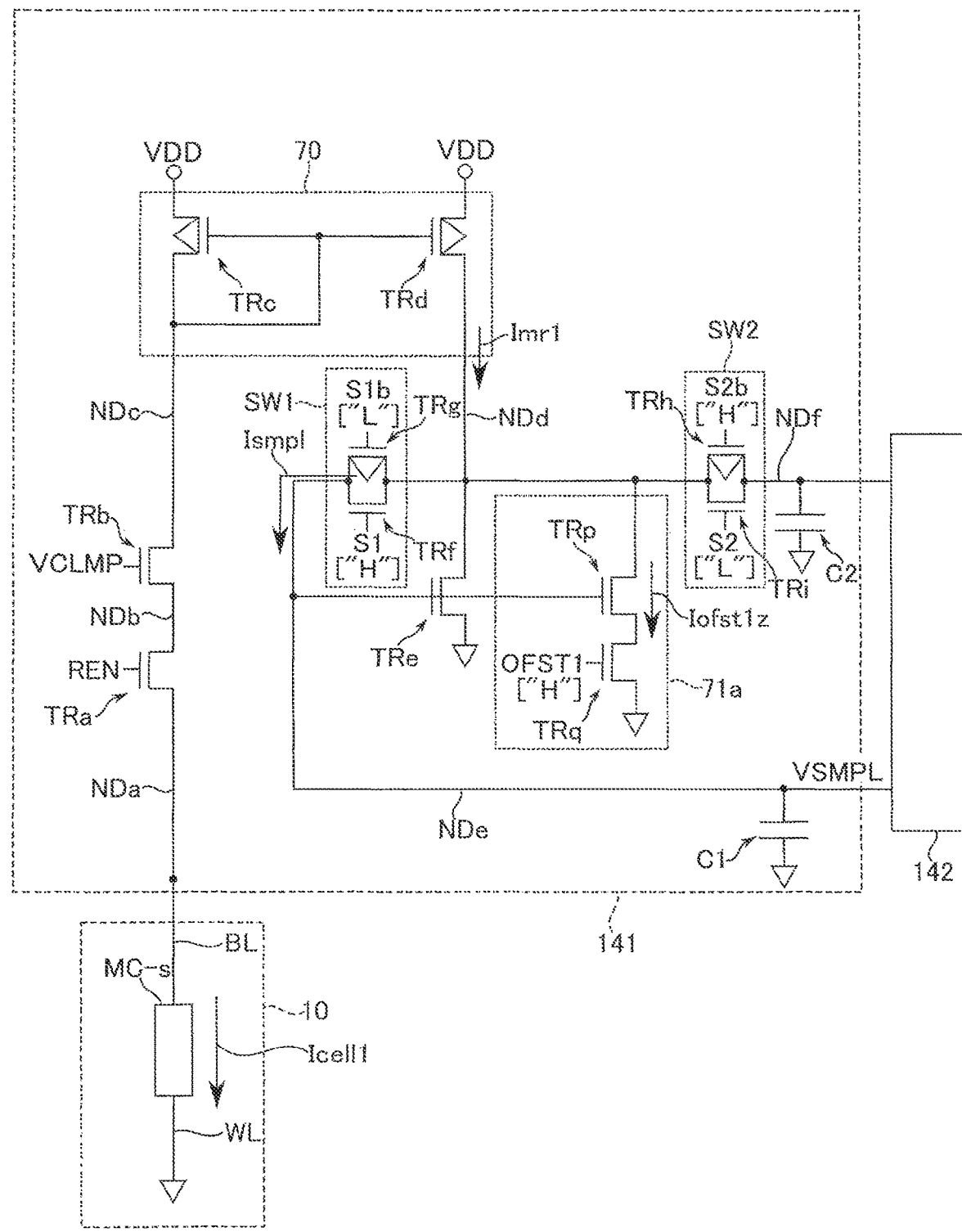
FIG. 21 is a diagram showing an example of the operation of a memory device according to the third embodiment.

FIG. 21 is a schematic view for explaining an example of the operation of the memory device according to this embodiment. FIG. 22 is a timing chart for explaining an example of the operation of the memory device according to the embodiment.

As shown in FIG. 21, in the read circuit of the MRAM 1 according to the first embodiment described above, the offset circuit 71a of the preamplifier 141 may not cause any offset current to flow at the time of the second cell access processing, and may cause an offset current Iofst1z to flow at the time of the first cell access processing.

With this operation the MRAM according to this embodiment applies the offset current Iofst1z to a mirror current Imr1 based on a cell current Icell1 in a selected cell MC-s in the held state of user data at the time of the first cell access processing.

Figure 22:
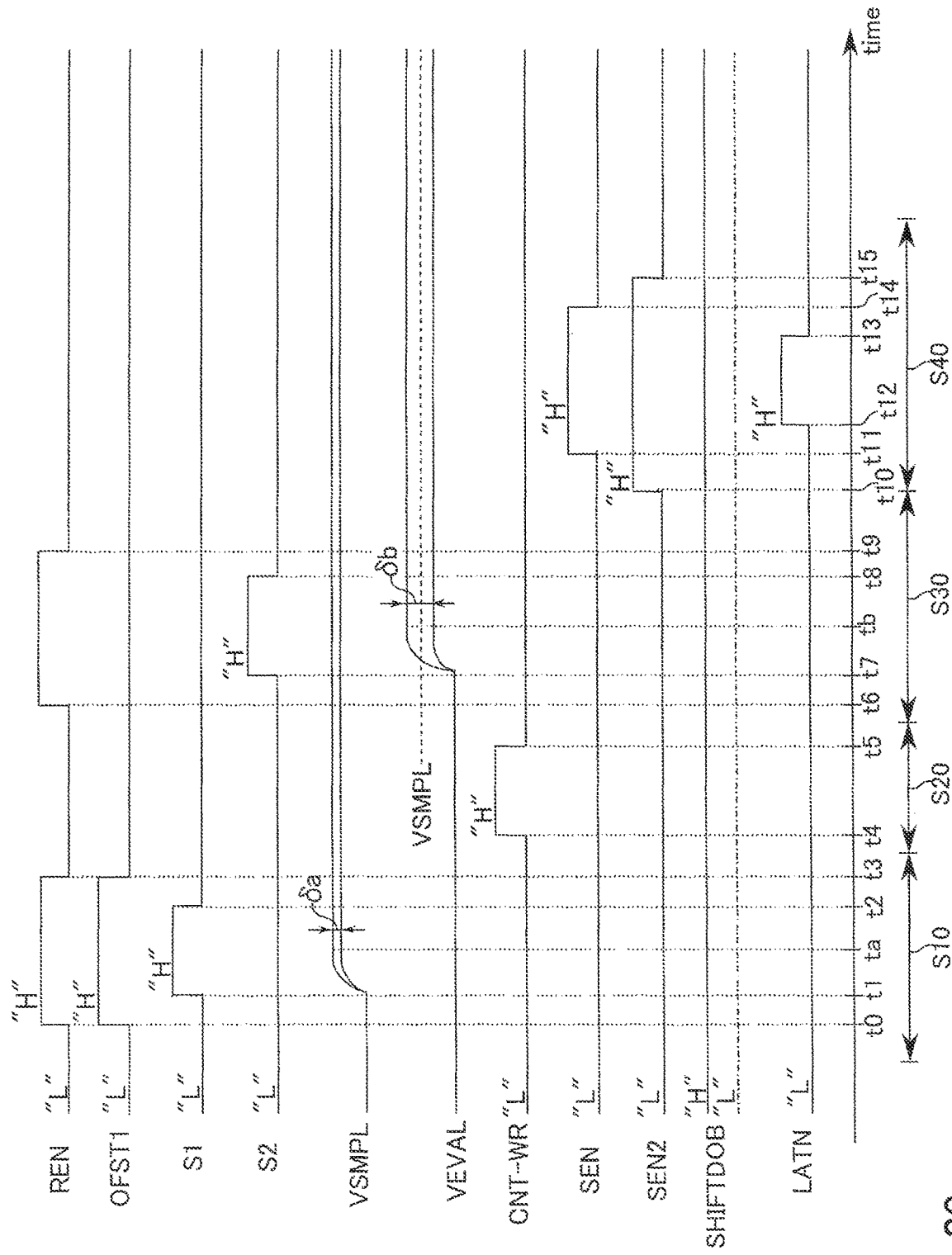
FIG. 22 is a timing chart showing an example of the operation of the memory device according to the third embodiment.

For example, as shown in FIG. 22, at time t1 during the first cell access processing, a preamplifier 141 changes the signal level of a signal OFST1 from "L" level to "H" level. This sets an offset circuit 71a in the activated state.

As shown in FIG. 21, in this embodiment, during the first cell access processing, the offset circuit 71a causes the offset current Iofst1z to flow from a node NDd to a ground terminal VSS. This applies the offset current Iofst1z to the mirror current Imr1 based on the cell current Icell1.

A node NDe is charged with the mirror current Imr1 to which the offset current Iofst1z is applied.

At the time of the second cell access processing, the preamplifier 141 maintains the signal level of the signal OFST1 at "L" level. This sets the offset circuit 71a in the inactivated state at the time of the second cell access processing. Accordingly, in this embodiment, the offset circuit 71a does not cause any offset current to flow during the second cell access processing.

A node NDf is charged with a mirror current Imr2 to which no offset current is applied.

Subsequently, a sense amplifier 142 executes sense processing as in the first embodiment. Note, however, that in the second embodiment, an offset circuit 72a is activated and an offset circuit 72b is inactivated in the sense amplifier 142. An offset current Ishfta in the offset circuit 72a is applied to a current I1.

With this operation, in this embodiment, data in a selected cell MC-s is discriminated.

For example, in this embodiment, an offset direction with respect to the sense result obtained by the offset circuit 71a differs from an offset direction with respect to the sense result obtained in the first embodiment. In this case, a voltage VEVAL-0 shifts to a voltage value higher than a voltage VSMPL (VSMPL-0 or VSMPL-1).

In this manner, the preamplifier 141 including the offset circuit 71a in FIG. 8 can control the offset direction with respect to a sense result by controlling the timing of activating the offset circuit 71a.

The MRAM according to this embodiment can obtain substantially the same effect as that described with reference to FIGS. 13, 14, 15, and 16.

Therefore, the memory device according to the third embodiment can obtain the same effects as those of the embodiments described above.

(4) Fourth Embodiment

The memory device according to the third embodiment will be described with reference to FIGS. 23 and 24.

Figure 23:
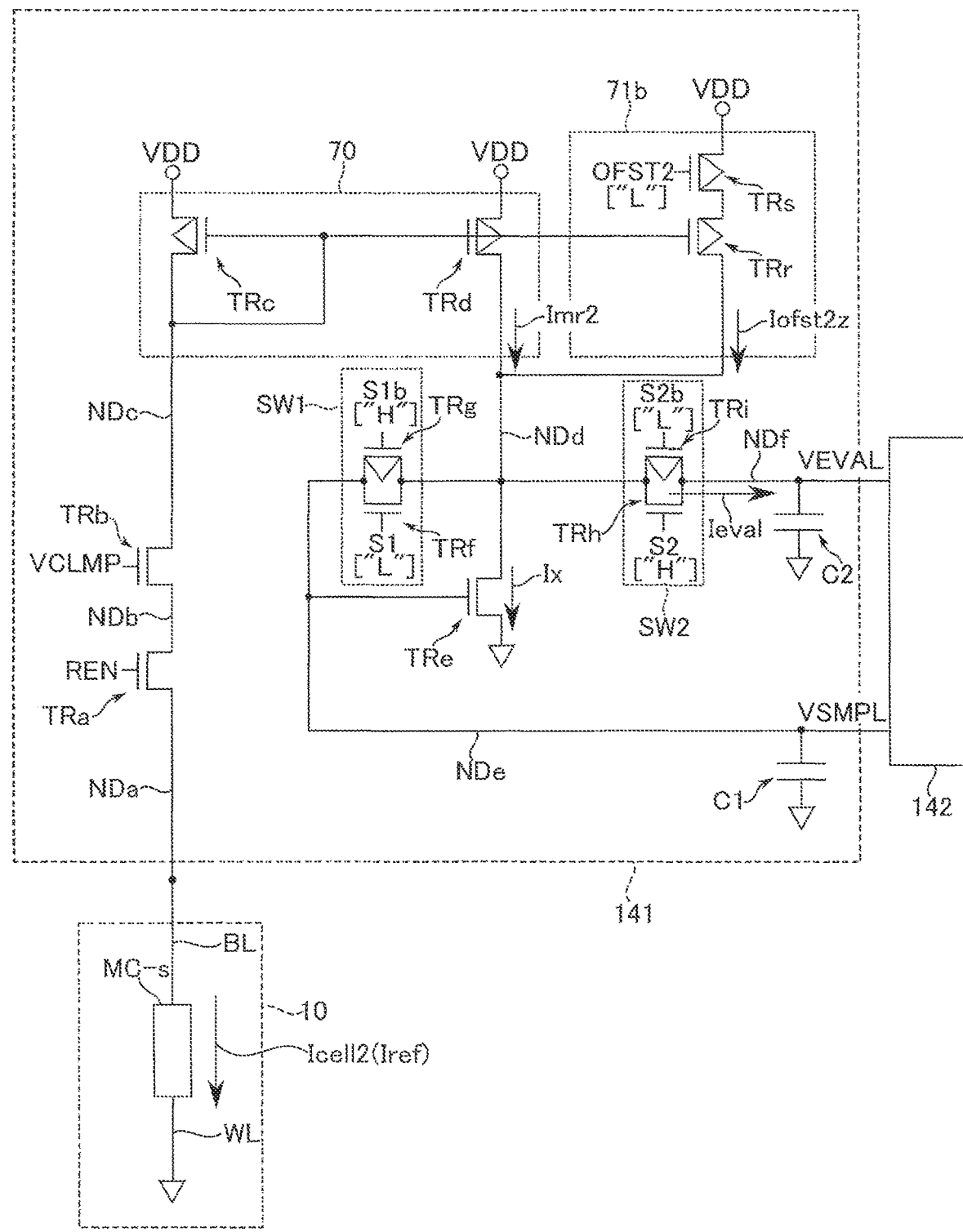
FIG. 23 is a diagram showing an example of the operation of a memory device according to the fourth embodiment.

FIG. 23 is a schematic view for explaining an example of the operation of a memory device (for example, an MRAM) according to this embodiment. FIG. 24 is a timing chart for explaining an example of the operation of the memory device according to the embodiment.

As shown in FIG. 23, in the read circuit of the MRAM 1 according to the second embodiment, the offset circuit 71b of the preamplifier 141 may not cause any offset current to flow at the time of the first cell access processing, and may cause the offset current Iofst2z to flow at the time of the second cell access processing.

With this operation, the MRAM according to this embodiment applies an offset current Iofst2z to a mirror current Imr2 based on a cell current Icell2 in a selected cell MC-s in the held state of reference data at the time of the second access processing.

Figure 24:
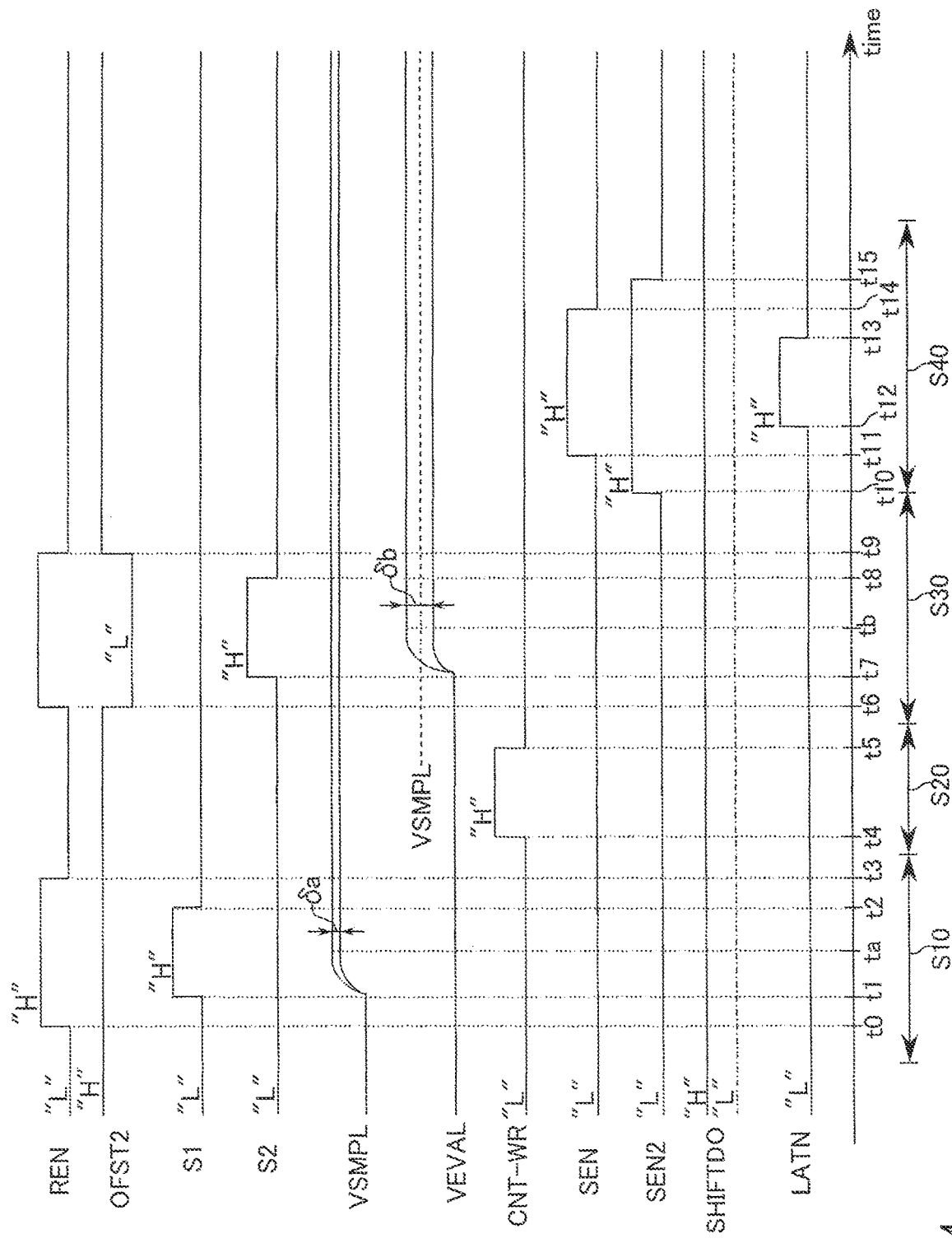
FIG. 24 is a timing chart showing an example of the operation of the memory device according to the fourth embodiment.

For example, as shown in FIG. 24, at the time of the first cell access processing, a preamplifier 141 maintains the signal level of a signal OFST1 at "H" level. This sets an offset circuit 71b in the inactivated state at the time of the first cell access processing. Accordingly, in this embodiment, an offset circuit 71a does not cause any offset current to flow during the first cell access processing.

A node NDe is charged with a mirror current Imr1 to which no offset current is applied.

At time t6 during the second cell access processing, the preamplifier 141 changes the signal level of the signal OFST1 from "H" level to "L" level. This activates the offset circuit 71b.

As shown in FIG. 23, in this embodiment, during the second cell access processing, the offset circuit 71b causes an offset current Iofst2z to flow from a power supply terminal VDD to a node NDd. This applies the offset current Iofst2z to a mirror current Imr2 based on a cell current Icell2.

A node NDf is charged with the mirror current Imr2 to which the offset current Iofst2z is applied.

Subsequently, the sense amplifier 142 executes sense processing as in the second embodiment described above. Note, however, that in this embodiment, the offset circuit 72a is inactivated and an offset circuit 72b is activated in the sense amplifier 142. The offset circuit 72b applies an offset current Ishftb to a current I2.

With this operation, in this embodiment, data in the selected cell M is discriminated.

For example, in this embodiment, an offset direction with respect to the sense result obtained by the offset circuit 71b differs from an offset direction with respect to the sense result obtained in the second embodiment. In this case, a voltage VEVAL-0 shifts to a voltage value higher than a voltage VSMPL (VSMPL-0 or VSMPL-1).

In this manner, the preamplifier 141 including the offset circuit 71b in FIG. 17 can control the offset direction with respect to a sense result by controlling the timing of activating the offset circuit 71b.

The MRAM 1 according to this embodiment can obtain substantially the same effect as that described with reference to FIGS. 13, 14, 15, and 16.

Therefore, the memory device according to the fourth embodiment can obtain the same effects as those of the embodiments described above.

(5) Fifth Embodiment

A memory device according to the fifth embodiment will be described with reference to FIG. 25.

Figure 25:
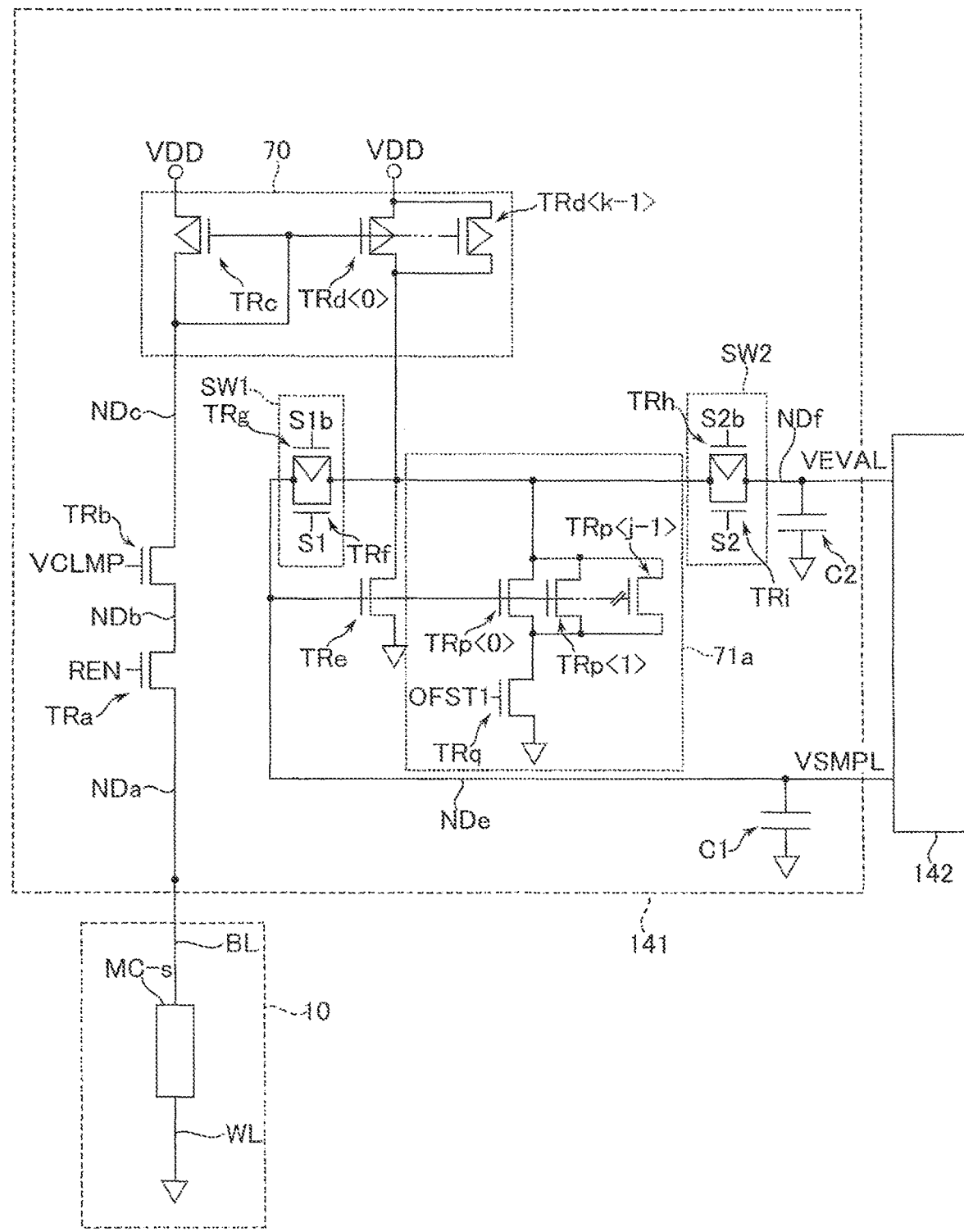
FIG. 25 is an equivalent circuit diagram showing an example of the configuration of a memory device according to the fifth embodiment.

FIG. 25 is a circuit diagram showing an example of the configuration of the memory device (for example, an MRAM) according to this embodiment.

As shown in FIG. 25, an offset circuit 71a includes a plurality of field-effect transistors TRp<0> to TRp<j−1>, where j is an integer equal to or more than 1. The transistor TRp that causes an offset current to flow is constituted by a plurality of field-effect transistors.

A plurality of transistors TRp<0> to TRp<j−1> may have the same gate size (for example, gate width) or different gate sizes.

The current paths of a plurality of transistors TRp<1> to TRp<j−1> are connected in parallel with the current path of the transistor TRp<0>. The gates of the transistors TRp<1> to TRp<j−1> are connected to the gate of the transistor TRp<0>.

The plurality of transistors TRp<0> to TRp<j−1> effectively function as one transistor (to be referred to as an offset transistor hereinafter) TRp that outputs an offset current Iofst.

The transistors TRp<0> to TRp<j−1> are trimmed in accordance with the current value set by the offset current Iofst.

For example, the gates of a given number (k) of transistors of the plurality of transistors TRp<1> to TRp<j−1> are electrically separated from the gate of the transistor TRq<0> by melting, a switching circuit, or the like. In this case, k is an integer equal to or more than 0 and equal to or less than j−1.

Accordingly, the effective gate width of the offset transistor TRp including the (j−k) transistors TR<0> to TRp<j−k−1> is smaller than the effective gate width of the offset transistor TRp including the j transistors TRp<0> to TRp<j−1>.

As a result, the current value of the offset current Iofst caused to flow by the offset transistor TRp including the (j−k) transistors TRp<0> to TRp<j−k−1> is smaller than the current value of the offset current Iofst caused to flow by the offset transistor TRp including the j transistors TRp<0> to TRp<j−1>.

In this manner, the current value of the offset current Iofst caused to flow by the transistor TRp is adjusted in accordance with the number of transistors TRp<0> to TRp<j−1> of the offset circuit 71a.

Note that the number (k) of transistors TRp<0> to TRp<j−1> to be trimmed is determined as appropriate by a test process of the MRAM 1.

When the current value of an offset current made to flow by the offset circuit 71a has a desired magnitude, trimming is not sometimes executed for the plurality of transistors TRp<0> to TRp<j−1>.

Note that a transistor TRd of a current mirror circuit 70 may be constituted by a plurality of field-effect transistors TRd<0> to TRd<h−1> like the transistor TRp (TRp<0> to TRp<j−1). In this case, h is an integer equal to or more than 1.

This makes it possible to adjust the magnitude of a mirror current Imr with respect to a cell current Icell. For example, the gate size of the transistor TRd (the current ratio between the transistor TRc and the transistor TRd) is set as appropriate in accordance with the magnetic resistance value (or the MR ratio) of an MTJ element used for a memory element.

The memory device according to this embodiment can obtain the same effects as those of the embodiments described above.

(6) Sixth Embodiment

A memory device according to the sixth embodiment will be described with reference to FIG. 26.

FIG. 26 is a circuit diagram showing an example of the configuration of the memory device (for example, an MRAM) according to this embodiment.

As shown in FIG. 26, an offset circuit 71b may include a plurality of transistors TRr<0> to TRr<j−1> having current paths connected in parallel.

The plurality of transistors TRr<0> to TRr<j−1> effectively function as one transistor (to be referred to as an offset transistor hereinafter) TRr that outputs an offset current Iofst.

In this case, as in the case shown in FIG. 25, the current value of the offset current Iofst can be adjusted by trimming a predetermined number of transistors of the plurality of transistors TRr<0> to TRr<j−1>.

Note that the number (k) of transistors TRp<0> to TRp<j−1> to be trimmed is determined as appropriate by a test process of an MRAM 1. When the current value of an offset current caused to flow by the offset circuit 71b has a desired magnitude, the plurality of transistors TRp<0> to TRp<j−1> are sometimes not trimmed.

(7) Seventh Embodiment

A memory device according to the seventh embodiment will be described with reference to FIG. 27.

Figure 27:
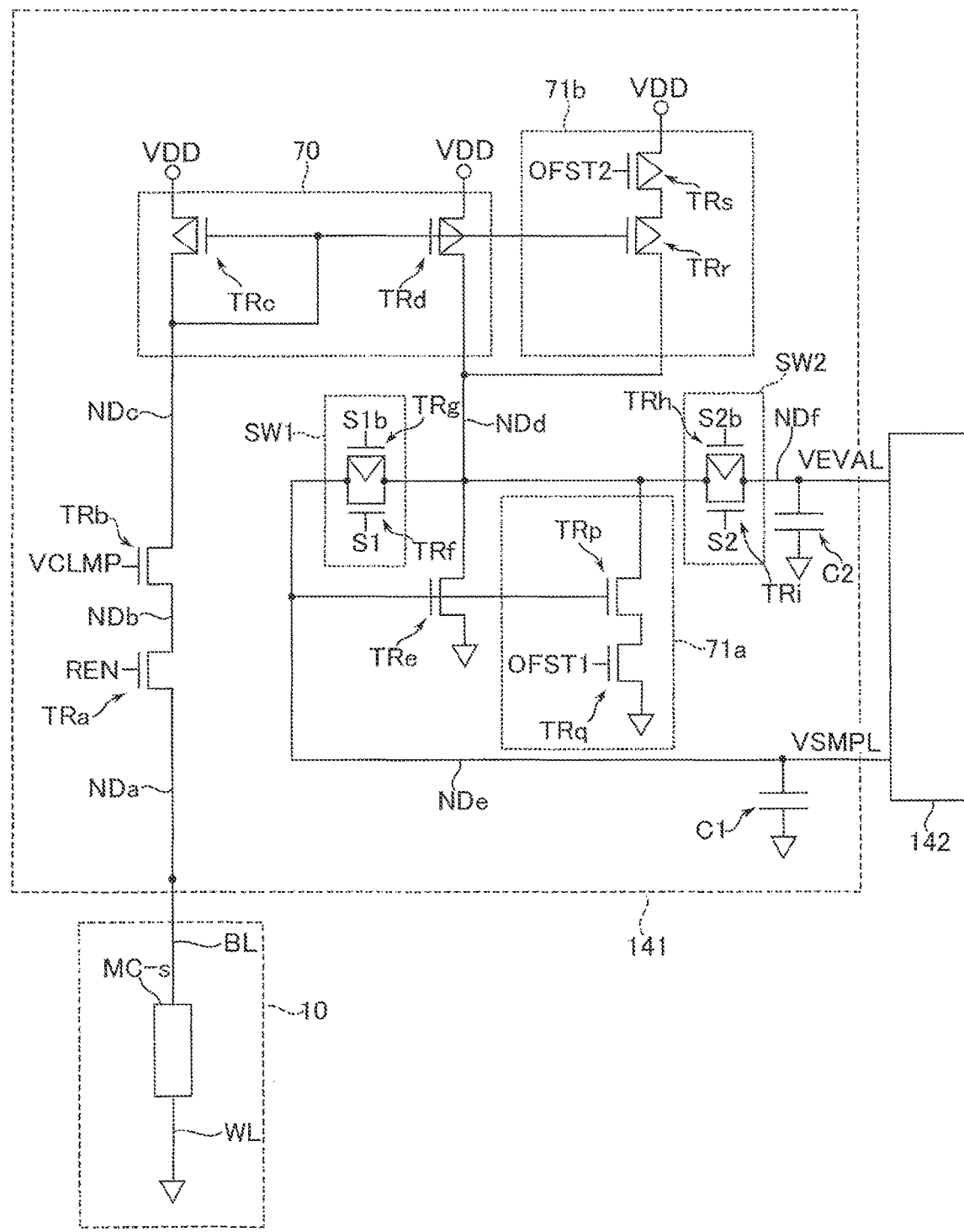
FIG. 27 is an equivalent circuit diagram showing an example of the configuration of a memory device according to the seventh embodiment.

FIG. 27 is a circuit diagram showing an example of the configuration, of the memory device (for example, an MRAM) according to this embodiment.

As shown in FIG. 27, one preamplifier 141 may include a plurality of offset circuits 71a and 71b.

In this embodiment, at the time of one read operation, one of the two offset circuits 71a and 71b is activated. With this operation, an offset current (offset value) is provided for a sense result in one of the first cell access processing and the second cell access processing.

The memory device according to this embodiment can obtain substantially the same effects as those of the embodiments described above.

(9) Others

The memory device according to the embodiments are not limited to the above embodiments and can be variously modified.

For example, the memory cell MC according to each embodiment described above is constituted by a magnetoresistance effect element and a two-terminal switching element. Note, however, that the memory cell MC may be constituted by a magnetoresistance effect element and a three-terminal switching element (for example, a field effect transistor).

Note that the memory devices according to the above embodiments each are exemplified as a memory device (for example, an MRAM) using a magnetoresistance effect element as a memory element.

Note, however, that the memory device according to this embodiment may use a variable resistance element different from a magnetoresistance effect element as a memory element.

For example, a memory device may be a resistance random access memory (for example, an ReRAM) or phase-change memory (for example, a PCRAM) as long as it is a device using an element that stores data by using a change in the resistance of the element.

The memory device according to this embodiment may be a volatile memory or a nonvolatile memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
    a memory cell; and
    a read circuit configured to sense a first signal based on first data in the memory cell, write second data in the memory cell, sense a second signal based on the second data in the memory cell, and read data in the memory cell based on a comparison result between the first signal and the second signal,
    wherein:
    the read circuit includes a pre-stage sense amplifier circuit configured to sense the first signal and the second signal, and
    the pre-stage sense amplifier circuit includes:
        a current mirror circuit configured to cause a first current to flow in a first node connected to the memory cell and cause a second current to flow in a second node based on a potential of the first node,
        a first switching element including a first terminal connected to the second node and a second terminal connected to a third node,
        a first transistor including a third terminal connected to the second node and a first gate connected to the third node,
        a second switching element including a fourth terminal connected to the second node and a fifth terminal connected to a fourth node, and
        a first circuit connected to the second node and the third node and configured to cause a third current to flow in the second node based on a potential of the third node.

2. The memory device according to claim 1, wherein:
    the first circuit does not cause the third current to flow when the pre-stage sense amplifier circuit senses the first signal, and
    the first circuit causes the third current to flow when the pre-stage sense amplifier circuit senses the second signal.

3. The memory device according to claim 1, wherein:
    the first circuit causes the third current to flow when the pre-stage sense amplifier circuit senses the first signal, and
    the first circuit does not cause the third current to flow when the pre-stage sense amplifier circuit senses the second signal.

4. The memory device according to claim 1, wherein the first circuit includes:
    a second transistor including a sixth terminal, a seventh terminal connected to the second node, and a second gate connected to the third node, and
    a third transistor including an eighth terminal connected to the sixth terminal, a ninth terminal connected to a ground terminal, and a third gate to which a first control signal is supplied.

5. The memory device according to claim 4, wherein:
    the second transistor causes the third current to flow from the second node to the ground terminal when the third transistor is activated based on the first control signal at a first level, and
    the second transistor does not cause the third current to flow when the third transistor is inactivated based on the first control signal at a second level.

6. The memory device according to claim 5, wherein a size of the second gate is smaller than a size of the first gate.

7. The memory device according to claim 1, wherein a current value of the third current is based on a potential of the third node.

8. The memory device according to claim 1, wherein:
    the read circuit further includes a post-stage sense amplifier circuit configured to compare the first signal with the second signal, and the post-stage sense amplifier circuit includes a second circuit configured to apply an offset value to one of the first signal of the third node and the second signal of the fourth node.

9. The memory device according to claim 1, wherein the memory cell includes a magnetoresistance effect element.

10. A memory device comprising:
a memory cell; and
a read circuit configured to sense a first signal based on first data in the memory cell, write second data in the memory cell, sense a second signal based on the second data in the memory cell, and read data in the memory cell based on a comparison result between the first signal and the second signal,
wherein:
the read circuit includes a pre-stage sense amplifier circuit configured to sense the first signal and the second signal, and
the pre-stage sense amplifier circuit includes:
a current mirror circuit configured to cause a first current to flow in a first node connected to the memory cell and cause a second current to flow in a second node based on a potential of the first node,
a first switching element including a first terminal connected to the second node and a second terminal connected to a third node,
a first transistor including a third terminal connected to the second node and a first gate connected to the third node,
a second switching element including a fourth terminal connected to the second node and a fifth terminal connected to a fourth node, and
a first circuit connected to the first node and the second node and configured to cause a third current to flow in the second node based on a potential of the first node.

11. The memory device according to claim 10, wherein:
the first circuit causes the third current to flow when the pre-stage sense amplifier circuit senses the first signal, and
the first circuit does not cause the third current to flow when the pre-stage sense amplifier circuit senses the second signal.

12. The memory device according to claim 10, wherein:
the first circuit does not cause the third current to flow when the pre-stage sense amplifier circuit senses the first signal, and the first circuit causes the third current to flow when the pre-stage sense amplifier circuit senses the second signal.

13. The memory device according to claim 10, wherein the first circuit includes:
a second transistor including a sixth terminal, a seventh terminal connected to the second node, and a second gate connected to the first node, and
a third transistor including an eighth terminal connected to the sixth terminal, a ninth terminal connected to a power supply terminal, and a third gate to which a first control signal is supplied.

14. The memory device according to claim 13, wherein:
the second transistor causes the third current to flow from the power supply terminal to the second node when the third transistor is activated based on the first control signal at a first level, and
the second transistor does not cause the third current to flow when the third transistor is inactivated based on the first control signal at a second level.

15. The memory device according to claim 13, wherein:
the current mirror circuit includes:
a fourth transistor including a tenth terminal connected to the first node and a fourth gate connected to the first node, and
a fifth transistor including a fifth gate connected to the first node and a first terminal connected to the second node, and
the second gate has a smaller size than the fifth gate.

16. The memory device according to claim 10, wherein a current value of the third current is based on a potential of the first node.

17. The memory device according to claim 10, wherein:
the read circuit further includes a post-stage sense amplifier circuit configured to compare the first signal with the second signal, and
the post-stage sense amplifier circuit includes a second circuit configured to apply an offset value to one of the first signal of the third node and the second signal of the fourth node.

18. The memory device according to claim 10, wherein the memory cell includes a magnetoresistance effect element.

* * * * *